(12) United States Patent
Namba et al.

(10) Patent No.: US 7,469,389 B2
(45) Date of Patent: Dec. 23, 2008

(54) STANDARD CELL LIBRARY, METHOD OF DESIGNING SEMICONDUCTOR INTEGRATED CIRCUIT, SEMICONDUCTOR INTEGRATED CIRCUIT PATTERN, AND SEMICONDUCTOR INTEGRATED CIRCUIT

(75) Inventors: Yasunari Namba, Chiba (JP); Takahiro Yamamoto, Chiba (JP)

(73) Assignee: Kawasaki Microelectronics, Inc., Chiba (JP)

( * ) Notice: Subject to any disclaimer, the term of this patent is extended or adjusted under 35 U.S.C. 154(b) by 211 days.

(21) Appl. No.: 11/543,148

(22) Filed: Oct. 5, 2006

(65) Prior Publication Data

US 2007/0083842 A1  Apr. 12, 2007

Related U.S. Application Data

(60) Provisional application No. 60/728,740, filed on Oct. 21, 2005.

(30) Foreign Application Priority Data

Oct. 7, 2005  (JP)  ............................... 2005-294646

(51) Int. Cl.
 *G06F 17/50* (2006.01)
(52) U.S. Cl. .............................................. 716/1; 716/9
(58) Field of Classification Search .................... 716/1, 716/8–10
See application file for complete search history.

(56) References Cited

U.S. PATENT DOCUMENTS

| 6,295,636 B1 * | 9/2001 | Dupenloup ................... 716/18 |
| 6,301,692 B1 * | 10/2001 | Kumashiro et al. ........... 716/10 |
| 6,834,375 B1 * | 12/2004 | Stine et al. ..................... 716/2 |

FOREIGN PATENT DOCUMENTS

| JP | A 2004-172627 | 6/2004 |
| JP | A 2005-072133 | 3/2005 |

* cited by examiner

*Primary Examiner*—Thuan Do
*Assistant Examiner*—Binh C Tat
(74) *Attorney, Agent, or Firm*—Oliff & Berridge, PLC

(57) ABSTRACT

An exemplary cell library includes a first plurality of types of standard cells. Each of the first plurality of types of standard cells includes threshold voltage adjusting patterns. The upper and the lower boundaries of the threshold voltage adjusting patterns contact the upper and lower boundaries of the cell frame and the distances between the left and right boundaries of the threshold voltage adjusting patterns and the cell frame are set appropriately. Accordingly, it is possible to place standard cells including transistors with different threshold voltages at arbitrary positions without increasing the area of a circuit block or the design cost.

34 Claims, 12 Drawing Sheets

PRIOR ART

STANDARD CELL LIBRARY, METHOD OF DESIGNING SEMICONDUCTOR INTEGRATED CIRCUIT, SEMICONDUCTOR INTEGRATED CIRCUIT PATTERN, AND SEMICONDUCTOR INTEGRATED CIRCUIT

CROSS-REFERENCE TO RELATED APPLICATION

Exemplary embodiments of this invention were first described in Japanese Patent Application No. 2005-294646, which is hereby incorporated by reference in its entirety.

This application is based on Provisional Application No. 60/728,740, filed Oct. 21, 2005, the entire disclosure of which is hereby incorporated by reference.

BACKGROUND

Exemplary embodiments of this invention relate to a standard cell library that includes a plurality of types of standard cells, a method of designing semiconductor integrated circuits utilizing standard cells, a semiconductor integrated circuit pattern including a circuit block in which a plurality of types of standard cells is arranged, and a semiconductor integrated circuit in which the semiconductor integrated circuit pattern is formed on a semiconductor substrate.

In the design of semiconductor integrated circuits using standard cell technology, a plurality of types of standard cells having various functions is prepared in a library. In these standard cells, patterns in a plurality of layers necessary to realize respective functions are arranged in respective cell frames. Each of the cell frames has the same height and a width of a unit width multiplied by an integer. Some of the plurality of types of standard cells that are required to meat the specification are selected and are arranged in vertical and horizontal directions with their frame boundaries contacting each other. The structure and the arrangement method of the standard cell are explained in, for example, Japanese Laid-open Patent 2005-72133 (Patent Document 1).

In order to suppress excessive leakage current and to realize necessary operation speed, on the other hand, it becomes common to construct semiconductor integrated circuits with transistors having different threshold voltages. That is, high threshold voltage transistors, which have low operation speed and low leakage current, are used in circuits and signal transmission paths that do not need high operation speed, while low threshold voltage transistors, which have high leakage current and high operation speed, are used in circuits and signal transmission paths that need high operation speed.

For example, Japanese Laid-open Patent 2004-172627 (Patent Document 2) proposes, in FIG. 15, to add a process step to additionally distribute impurities under the gate electrodes of high threshold voltage transistors. Thus, according to this reference, threshold voltages of MOSFETs that constitute logic gates in arbitrary positions in a semiconductor integrated circuit can be modified freely.

However, the study by the inventors of this application has indicated that a restriction may be applied to the arrangement of the standard cells if the technology that the transistors with different threshold voltages are formed by addition of impurity, as proposed in the Patent Document 2, is applied to the standard cell technology.

FIG. 12 is a layout diagram showing an example of a conventional standard cell. In FIG. 12, within a cell frame 112 shown with a solid line, patterns in a plurality of layers required for realizing the function of the standard cell 110 is arranged. The standard cell 110 shown in FIG. 12 has a function of an inverter, and the patterns in some of the plurality of layers, i.e., N-well pattern 114, active region patterns 116 and 118, gate pattern 120, and P-channel threshold voltage adjusting pattern 122 and N-channel threshold voltage adjusting pattern 124 are shown. The patterns in other layers are omitted.

An N-well pattern 114 is provided on the upper side of FIG. 12. The N-well pattern 114 extends from inside of the cell frame 112 to the outside of the upper boundary 112a and the left and right boundaries 112c, 112d of the cell frame. The portion extending to the outside of the cell frame 112 will be merged when a plurality of standard cells is placed to form a circuit block such that the boundaries of their cell frames are in contact with each other.

A first active region pattern 116 is provided within the N-well pattern 114, and a gate electrode pattern 120 that goes through over the first active region pattern 116 in the vertical direction is also provided. These are patterns for forming a P-channel MOS transistor (a PMOS transistor) 140 on a semiconductor substrate. That is, a channel region 142 of the PMOS transistor 140 is formed at the portion where the gate electrode pattern 120 overlaps the first active region pattern 116. Further, a source region 144 and a drain region 146 of the PMOS transistor 140 are formed on both sides of the gate electrode pattern 120 within the first active region pattern 116.

A P-well is formed outside of the N-well pattern 114, or on the lower side of FIG. 12. That is, an impurity for forming the P-well is doped by using a mask that is formed by a reversed data of the N-well pattern 114. And an N-channel MOS transistor (an NMOS transistor) 150 is formed by a second active region pattern 118 arrange on the lower side of FIG. 12 and the gate electrode pattern 120 that goes through over the second active region pattern 118 in the vertical direction. A channel region 152 of the NMOS transistor 150 is formed at the portion where the gate electrode pattern 120 overlaps the second active region pattern 118. A source region 154 and a drain region 156 of the NMOS transistor 150 are formed on both sides of the gate electrode pattern 120 within the second active region pattern 118.

Here, the threshold voltages of the PMOS transistor 140 and the NMOS transistor are determined by impurity concentrations of the respective channel region. For example, the higher the respective impurity concentrations, the higher the threshold voltages.

The standard cell 110 shown in FIG. 12 included a first threshold voltage adjusting pattern 122 and a second threshold voltage adjusting pattern 124 for adjusting the threshold voltages of the PMOS transistor 140 and the NMOS transistors 150. The first threshold voltage adjusting pattern 122 is a pattern for forming a mask that is used for adjusting the threshold voltage of the PMOS transistor 140 by additionally doping impurities in the channel region 142 of the PMOS transistor 140. The second threshold voltage adjusting pattern 142 is a pattern for forming a mask that is used for adjusting the threshold voltage of the NMOS transistor 150 by additionally doping impurities in the channel region 152 of the NMOS transistor 150.

In practice, two standard cells that are the same except for having or not having the first and the second threshold voltage adjusting patterns 122 and 124 are prepared. These cells have the common function, but the threshold voltages of the PMOS transistor 140 and the NMOS transistor 150 are different with each other.

SUMMARY

In the standard cell shown in FIG. 12, dimensions and positions of the patterns in respective layers are set to meet a design rule. Concerning the threshold voltage adjusting patterns 122 and 124, they need to surround respective channel region patterns 142 and 152, and to further extend outwardly from the respective channel region patterns to predetermined dimensions. On the other hand, the channel region patterns may extend to the vicinity of the upper and lower boundaries 112a and 112b of the cell frame 112 in order to increase driving capabilities of the transistors 140 and 150.

FIG. 12 shows an example that the upper end of the P channel region pattern 142 extends to the vicinity of the upper boundary 112a, and the lower end of the N channel region pattern 152 extends to the vicinity of the lower boundary 112b of the cell frame 112. As a result, the distance between the upper boundary 122a of the first threshold voltage adjusting pattern 122 and the upper boundary 112a of the cell frame 112, and the distance between the lower boundary 124b of the second threshold voltage adjusting pattern 124 and the lower boundary 112b of the cell frame 112 are made small.

FIG. 13 is a layout diagram showing a part of a circuit block 170 formed by placing a plurality of the standard cells 110 together with other types of standard cells. In FIG. 13, within each of two rows R11 and R12, which are adjacent with each other in the vertical direction, a plurality of the standard cells 110 shown in FIG. 12 are arranged or placed adjacently in the horizontal direction. In the lower row R11 shown in FIG. 13, the standard cell 110 shown in FIG. 12 is placed with the same layout as shown in FIG. 12. In the upper row R12, on the other hand, the standard cell shown in FIG. 12 is placed with a vertically flipped layout.

In each of the rows, the standard cells 110 are placed such that the left and right boundaries 112c and 112d of the cell frames 112 contact with each other. Further, at the boundary between the vertically adjacent rows R11 and R12, the standard cells 110 are placed such that the upper boundaries 112a of the cell frames 112 contact with each other.

As previously described, in the standard cell shown in FIG. 12, the distance between the upper boundary 122a of the first threshold voltage adjusting pattern 122 and the upper boundary 112a of the cell frame 112 is very small. As a result, in the circuit block 170 shown in FIG. 13, the distance between the first threshold voltage adjusting patterns 122 of two standard cells 110, which are adjacent with each other in the vertical direction (i.e., the space S11 shown in FIG. 13), may become very small. This space S11 may be less than the smallest allowable space Smin between adjacent threshold voltage adjusting patterns set by the design rule. That is, a design rule violation may occur.

Although not shown in FIG. 13, similar design rule violation may also occur between the standard cell placed in the lower row R11 and another standard cell placed in the next lower row below the lower row R11. That is, the space between the second threshold voltage adjusting patterns 124 may be less than the smallest allowable space.

When performing adjustment of the threshold voltage by additionally doping impurities, a resist pattern that covers areas outside of the threshold voltage adjusting patterns is formed. Thus, an extremely thin resist pattern is formed at the small space between the threshold voltage adjusting patterns. Such an extremely thin resist pattern may easily be thrown down, and may disturb the doping of the impurities to the channel region of the transistor, or the adjustment of the threshold voltage of the transistor.

In order to prevent occurrence of such design rule violations, it is necessary to impose a restriction to the placement of the standard cells such that, for example, "standard cells having the threshold voltage adjusting patterns may not be placed adjacently in the vertical direction." Such restriction may increase the area and degrade the performance of the circuit block 170 formed by placing the standard cells.

Alternatively, the vertical dimension of the standard cell frame 112 may be increased to increase the distances between the boundaries of the threshold voltage adjusting patterns 122, 124 and the boundary of the cell frame 112. Such increase of the distances may prevent the occurrence of design rule violation. In this case, however, the dimension of the standard cell 110 increases and the dimension of the circuit block 170 increases. As a result, the cost of the semiconductor integrated circuit increases.

It is also conceivable to, after placing the standard cells 110 as shown in FIG. 13, add a dummy threshold voltage adjusting pattern at a position where a space smaller than the minimum allowable space is formed between the threshold voltage adjusting patterns 122 and 124, so that the space is filled. However, generation of such a dummy pattern requires a large amount of mathematical operation and increases the time and cost for designing the semiconductor integrated circuit.

Various exemplary embodiments of this invention provide a standard cell library and a method of designing semiconductor integrated circuit that enables to place standard cells including transistors with different threshold voltages at arbitrary positions without increasing the area of the semiconductor integrated circuit or the design cost. Various exemplary embodiments also provide a semiconductor integrated circuit pattern in which standard cells including transistors with different threshold voltages are placed at arbitrary positions without increase the area or the design cost, and to provide a semiconductor integrated circuit in which the semiconductor integrated circuit pattern is formed on a semiconductor substrate.

In order to address or solve the above, various exemplary embodiments according to this invention provide a standard cell library that includes a plurality of types of standard cells, each including patterns in a plurality of layers arranged within a cell frame having a fixed height and a width of an integer times a unit width Wu, for forming a semiconductor integrated circuit by placing selected ones of the plurality of types of standard cells such that left, right, upper, and lower boundaries of the cell frame are in contact with boundaries of other cell frames. The plurality of types of standard cells includes a first plurality of types of standard cells. The patterns of each of the first plurality of types of standard cells include: first transistor patterns for forming a first conduction-type transistor arranged within an upper side of the cell frame and second transistor patterns for forming a second conduction-type transistor arranged within a lower side of the cell frame; a first threshold voltage adjusting pattern for doping a first impurity to adjust an threshold voltage of the first conduction-type transistor, the first threshold voltage adjusting pattern having an upper boundary that contacts the upper boundary of the cell frame, and having a left and a right boundary; and a second threshold voltage adjusting pattern for doping a second impurity to adjust an threshold voltage of the second conduction-type transistor, the second threshold voltage adjusting pattern having a lower boundary that contacts the lower boundary of the cell frame, and having a left and a right boundary.

Each of a distance D1 between the left boundary of the first threshold voltage adjusting pattern and the left boundary of the cell frame, a distance D2 between the right boundary of the first threshold voltage adjusting pattern and the right boundary of the cell frame, a distance D3 between the left boundary of the second threshold voltage adjusting pattern and the left boundary of the cell frame, and a distance D4 between the right boundary of the second threshold voltage adjusting pattern and the right boundary of the cell frame is expressed as $Di=Wu \times ni/2$ (i=1, 2, 3, 4, ni is an integer equal to or larger than 0); and $Wu \geq Wmin$ and $Wu \geq Smin$ where Wmin is a minimum allowable width and Smin is a minimum allowable space set by a design rule of the semiconductor integrated circuit for each of the first and the second threshold voltage adjusting patterns, both n1 and n2 are even numbers or odd numbers and both n3 and n4 are even numbers or odd numbers for all of the first plurality of types of standard cells.

According to other various exemplary embodiments, each of distances D1, D2, D3, and D4 is expressed as $Di=di+Wu \times ni/2$ (i=1, 2, 3, 4, $-Wu/2<di<Wu/2$, ni is an integer equal to or larger than 0); $Wu \geq Wmin$ and $Wu \geq Smin$ where Wmin is a minimum allowable width and Smin is a minimum allowable space set by a design rule of the semiconductor integrated circuit for each of the first and the second threshold voltage adjusting patterns, both n1 and n2 are even numbers or odd numbers and both n3 and n4 are even numbers or odd numbers for all of the first plurality of types of standard cells. And all of the first plurality of types of standard cells have a same d1, a same d2, as same d3, and a same d4, $Wu+(d1+d2) \geq Smin$ and $Wu-(d1+d2) \geq Wmin$, $Wu+(d3+d4) \geq Smin$ and $Wu-(d3+d4) \geq Wmin$, $d1+d2 \leq 0$ when n1=n2=0 and $d3+d4 \leq 0$ when n3=n4=0.

In order to address or solve the above, various exemplary embodiments according to this invention provide a method of designing a semiconductor integrated circuit that includes: preparing a standard cell library including a plurality of types of standard cells, each including patterns in a plurality of layers arranged within a cell frame having a fixed height and a width of an integer times a unit width Wu; selecting at least some of the plurality of types of standard cells; and placing the selected ones of the standard cells along a grid having a horizontal pitch Ph while alternately flipping in a vertical direction to form a circuit block such that left, right, upper, and lower boundaries of the cell frame are in contact with boundaries of other cell frames. The plurality of types of standard cell includes a first plurality of types of standard cells. The patterns of each of the first plurality of types of standard cells include first transistor patterns for forming a first conduction-type transistor arranged within an upper side of the cell frame and second transistor patterns for forming a second conduction-type transistor arranged within a lower side of the cell frame; a first threshold voltage adjusting pattern for doping a first impurity to adjust an threshold voltage of the first conduction-type transistor, the first threshold voltage adjusting pattern having an upper boundary that contacts the upper boundary of the cell frame; and having a left and a right boundary; and a second threshold voltage adjusting pattern for doping a second impurity to adjust an threshold voltage of the second conduction-type transistor, the second threshold voltage adjusting pattern having a lower boundary that contacts the lower boundary of the cell frame, and having a left and a right boundary.

Each of a distance D1 between the left boundary of the first threshold voltage adjusting pattern and the left boundary of the cell frame, a distance D2 between the right boundary of the first threshold voltage adjusting pattern and the right boundary of the cell frame, a distance D3 between the left boundary of the second threshold voltage adjusting pattern and the left boundary of the cell frame, and a distance D4 between the right boundary of the second threshold voltage adjusting pattern and the right boundary of the cell frame is expressed as $Di=Ph \times ni/2$ (i=1, 2, 3, 4, ni is an integer equal to or larger than 0); and $Ph \geq Wmin$ and $Ph \geq Smin$ where Wmin is a minimum allowable width and Smin is a minimum allowable space set by a design rule of the semiconductor integrated circuit for each of the first and the second threshold voltage adjusting patterns, both n1 and n2 are even numbers or odd numbers and both n3 and n4 are even numbers or odd numbers for all of the first plurality of types of standard cells.

According to various other exemplary embodiments, each of distances D1, D2, D3, and D4 is expressed as $Di=di+Ph \times ni/2$ (i=1, 2, 3, 4, $-Ph/2<di<Ph/2$, ni is an integer equal to or larger than 0); $Ph \geq Wmin$ and $Ph \geq Smin$ where Wmin is a minimum allowable width and Smin is a minimum allowable space set by a design rule of the semiconductor integrated circuit for each of the first and the second threshold voltage adjusting patterns, both n1 and n2 are even numbers or odd numbers and both n3 and n4 are even numbers or odd numbers for all of the first plurality of types of standard cells. And all of the first plurality of types of standard cells have a same d1, a same d2, a same d3, and a same d4, $Ph+(d1+d2) \geq Smin$ and $Ph-(d1+d2) \geq Wmin$, $Ph+(d3+d4) \geq Smin$ and $Ph-(d3+d4) \geq Wmin$, $d1+d2 \leq 0$ when n1=n2=0 and $d3+d4 \leq 0$ when n3=n4=0.

According to various exemplary embodiments, the method may further includes: checking if there is violation of the design rule in each of the first and the second threshold voltage adjusting patterns in the formed circuit block; and resolving the violation by placing a violation-resolving pattern, which is prepared beforehand, to a position where the violation is found by the checking.

In order to address or solve the above, various exemplary embodiments according to this invention provide a semiconductor integrated circuit pattern that includes: a circuit block formed by placing a plurality of types of standard cells, each including patterns in a plurality of layers arranged within a cell frame having a fixed height and a width of an integer times a unit width Wu, along a grid while alternately flipping in a vertical direction such that left, right, upper, and lower boundaries of the cell frame are in contact with boundaries of other cell frames. The plurality of types of standard cells includes a first plurality of types of standard cells. The patterns of each of the first plurality of types of standard cells include: first transistor patterns for forming a first conduction-type transistor arranged within an upper side of the cell frame and second transistor patterns for forming a second conduction-type transistor arranged within a lower side of the cell frame; a first threshold voltage adjusting pattern for doping a first impurity to adjust an threshold voltage of the first conduction-type transistor, the first threshold voltage adjusting pattern having an upper boundary that contacts the upper boundary of the cell frame, and having a left and a right boundary; and a second threshold voltage adjusting pattern for doping a second impurity to adjust an threshold voltage of the second conduction-type transistor, the second threshold voltage adjusting pattern having a lower boundary that contacts the lower boundary of the cell frame, and having a left and a right boundary.

Each of a distance D1 between the left boundary of the first threshold voltage adjusting pattern and the left boundary of the cell frame, a distance D2 between the right boundary of the first threshold voltage adjusting pattern and the right boundary of the cell frame, a distance D3 between the left boundary of the second threshold voltage adjusting pattern and the left boundary of the cell frame, and a distance D4 between the right boundary of the second threshold voltage adjusting pattern and the right boundary of the cell frame is expressed as Di=Ph×ni/2 (i=1, 2, 3, 4, ni is an integer equal to or larger than 0); and Ph≧Wmin and Ph≧Smin where Wmin is a minimum allowable width and Smin is a minimum allowable space set by a design rule of the semiconductor integrated circuit for each of the first and the second threshold voltage adjusting patterns, both n1 and n2 are even numbers or odd numbers and both n3 and n4 are even numbers or odd numbers for all of the first plurality of types of standard cells.

According to various exemplary embodiments, same violation-resolving patterns may be placed at a plurality of positions where design rule violations occur in each of the first and the second threshold voltage adjusting patterns in the circuit block such that the violations are resolved.

In order to address or solve the above, various exemplary embodiments according to this invention further provide a semiconductor integrated circuit that includes a semiconductor integrated circuit pattern formed on a semiconductor substrate.

These and other features and details are described in, or are apparent from, the following detailed description.

BRIEF DESCRIPTION OF THE DRAWINGS

Various exemplary details of systems and methods are described, with reference to the following figures, wherein.

DETAILED DESCRIPTION OF EMBODIMENTS

Figure 1:
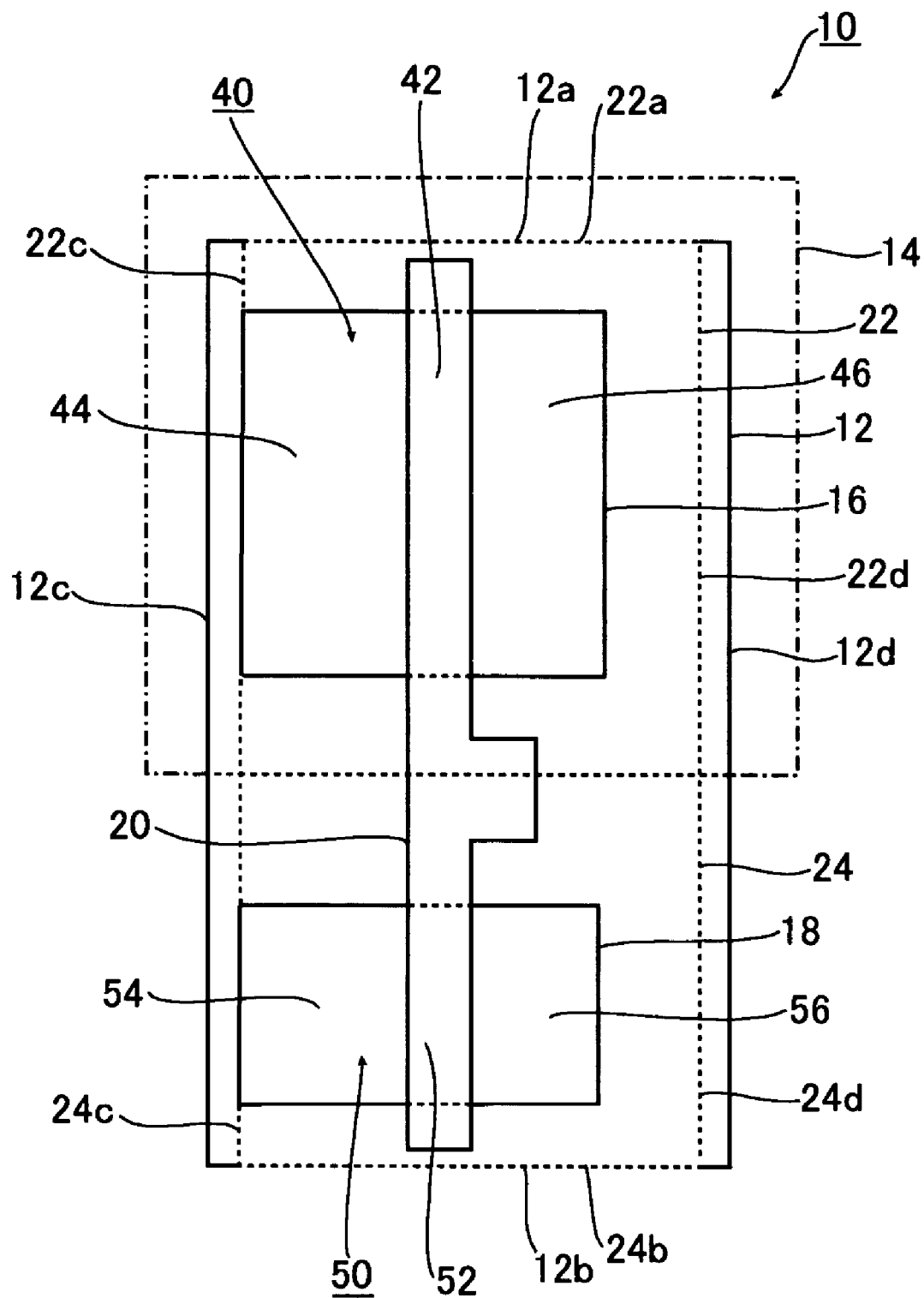
FIG. 1 is an exemplary layout diagram showing an exemplary standard cell included in an exemplary cell library according to this invention.

FIG. 1 is an exemplary layout diagram showing pattern arrangements in respective layers of an exemplary standard cell, which is included in the cell library according to an exemplary embodiment of this invention.

Figure 12:
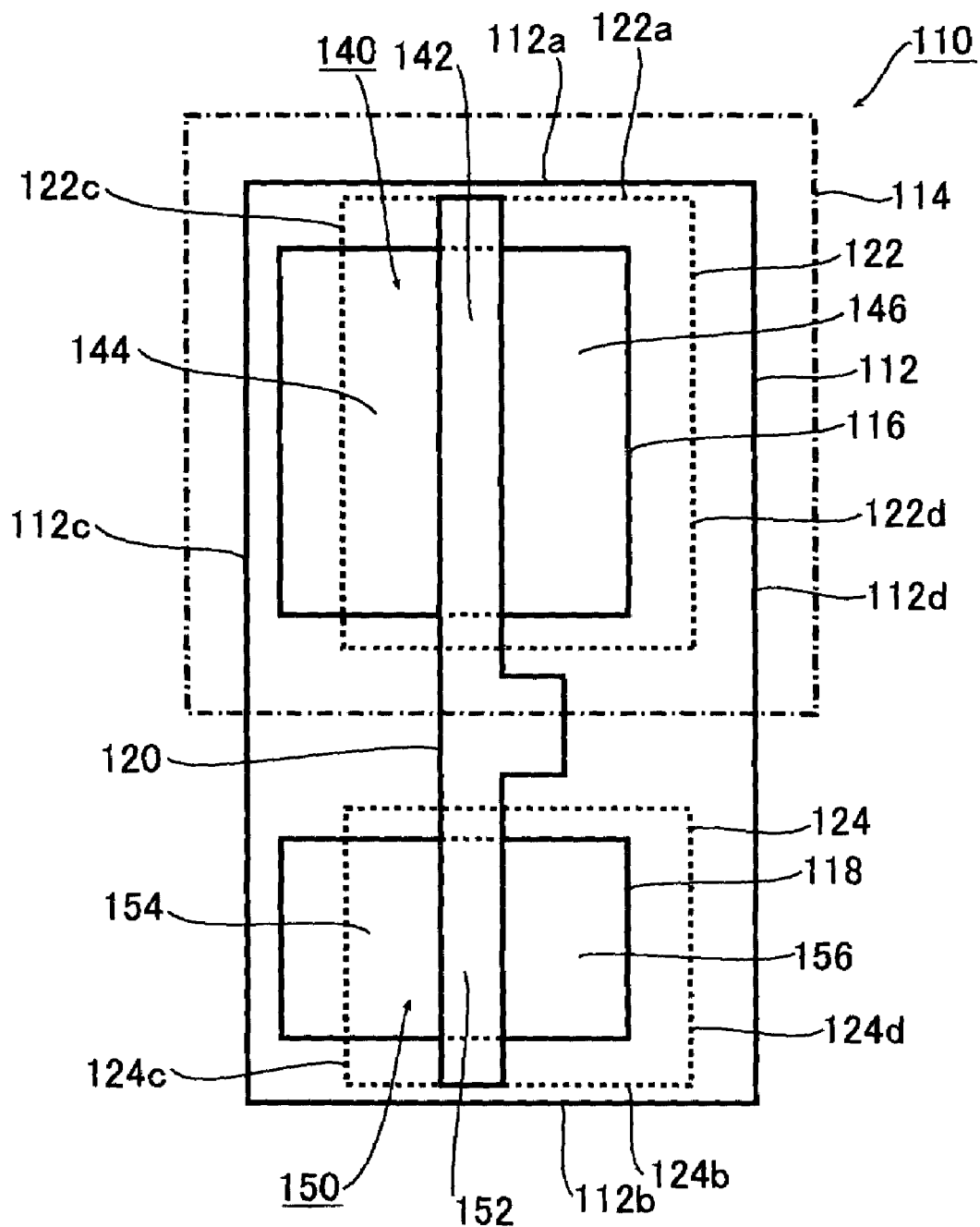
FIG. 12 is a layout diagram showing an exemplary layout of a conventional standard cell.
Figure 13:
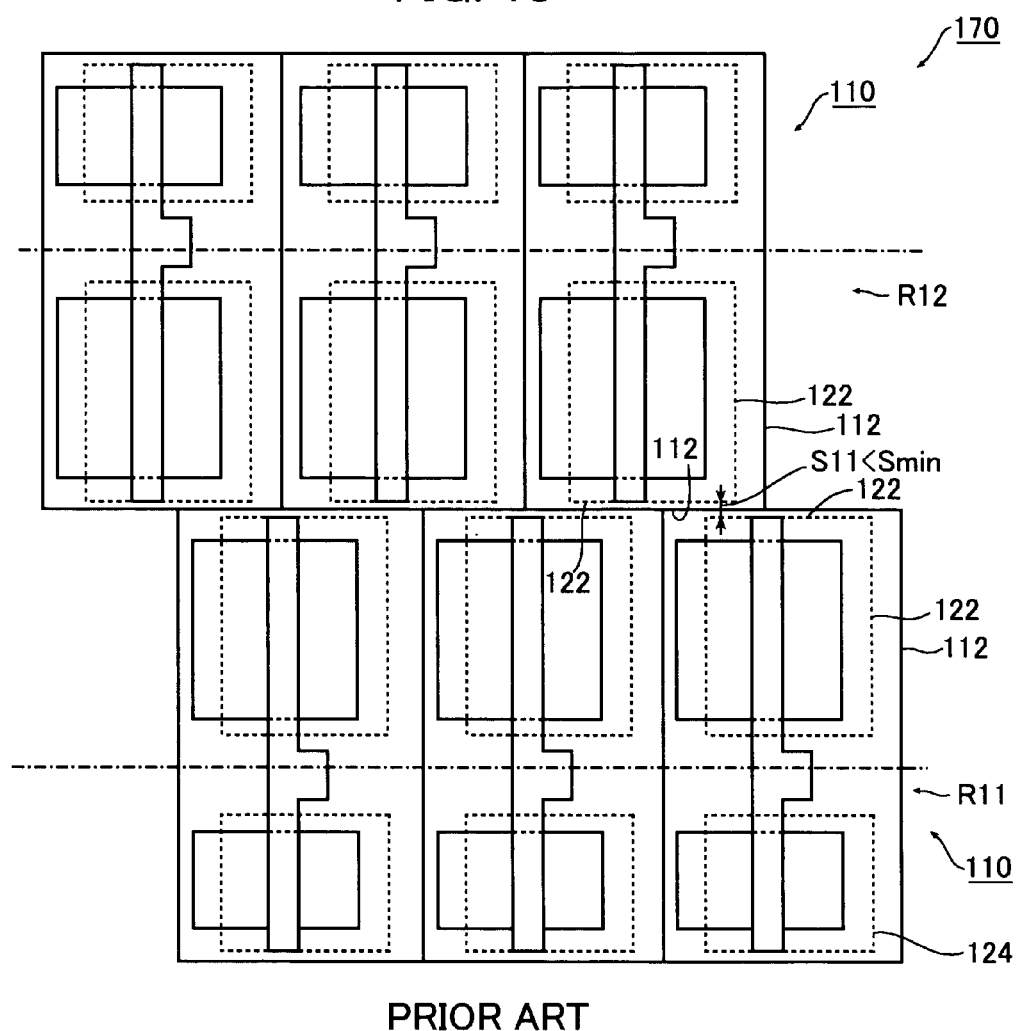
FIG. 13 is a layout diagram showing an exemplary circuit block formed by placing the standard cells shown in FIG. 12.

In the exemplary standard cell 10 shown in FIG. 1, same as the conventional standard cell shown in FIG. 12, patterns in a plurality of layers, such as well layers, active layers, a gate layer, and wiring layers, that are required for realizing the function of the standard cell 10 is arranged within a cell frame 12. The exemplary standard cell 10 may be placed together with various other types of standard cells in rows and columns, using a CAD system, to form a circuit block in a semiconductor integrated circuit pattern. Then, the semiconductor integrated circuit pattern created using the CAD system may be processed to generate mask patterns of the plurality of layers. Using the mask patterns thus generated, masks of respective layers are formed.

Using the masks thus formed, manufacturing of semiconductor integrated circuits may be performed. That is, semiconductor integrated circuits each having a physical semiconductor integrated circuit pattern formed on a semiconductor substrate are manufactured using the masks. The semiconductor integrated circuit pattern formed on the semiconductor substrate includes physical patterns in the plurality of layers corresponding to the patterns of the standard cells. The physical patterns on the semiconductor substrate form transistors or other elements that performs the function of the standard cell.

The exemplary standard cell 10 shown in FIG. 1 has the same function as the conventional standard cell 110 shown in FIG. 12. Also, the size (the height and the width) of the cell frame 12 of the exemplary standard cell 10 is the same as that of the cell frame 112 of the conventional standard cell 110. Moreover, the patterns in respective layers of the N-well (the N-well pattern 14), the first active layer (the first active region pattern 16), the second active layer (the second active region pattern 18), and the gate layer (the gate pattern 20) of the exemplary standard cell 10 are the same as those of the conventional standard cell 110 shown in FIG. 12. Accordingly, in the manufactured semiconductor integrated circuit, in the upper side of the exemplary standard cell 10, a P-channel MOS transistor (PMOS transistor) 40 composed of a channel region 42, source region 44, and a drain region 46 is formed within an N-well. While, in the lower side of the standard cell 10, a N-channel MOS transistor (NMOS transistor) 50 composed of a channel region 52, a source region 54, and a drain region 56 is formed within a P-well, which is not shown.

Also same as the conventional standard cell 110, the exemplary standard cell 10 has a first threshold voltage adjusting pattern 22 for additionally doping impurities in the channel region 42 of the PMOS transistor 40, and a second threshold voltage adjusting pattern 24 for additionally doping impurities in the channel region 52 of the NMOS transistor 50. However, the shapes of the first and the second threshold voltage adjusting patterns 22 and 24 are different from those of the conventional standard cell 110 shown in FIG. 12.

Specifically, in the exemplary standard cell 10, the upper boundary 22a of the first threshold voltage adjusting pattern 22 contacts the upper boundary 12a of the cell frame 12. In addition, the lower boundary of the second threshold voltage adjusting pattern 24 contacts the lower boundary 12b of the cell frame 12. Accordingly, formation of small spaces that is not permitted by the design rule between the first or second threshold voltage adjusting patterns of the standard cells, which are placed adjacently with each other in the vertical direction, is prevented, except for specific cases.

It is possible to make either higher or lower the (absolute values of) threshold voltages depending on the conduction types of the impurities that are additionally doped using the mask formed by the threshold voltage adjusting patterns 22 and 24. For example, the NMOS transistor 50 typically has a positive threshold voltage. The threshold voltage of the NMOS transistor 50 increases when a P-type impurity is additionally doped, and decreases when an N-type impurity is additionally doped in the channel region 52 of the NMOS transistor 50. On the other hand, the PMOS transistor 40 typically has a negative threshold voltage. The absolute value of the threshold voltage of the PMOS transistor 40 increases when an N-type impurity is additionally doped, and decreases when a P-type impurity is additionally doped in the channel region 42 of the PMOS transistor.

In this specification, the following explanations will be made assuming that the additional doping using the threshold voltage adjusting patterns 22 or 24 makes the absolute values of threshold voltages of the MOS transistors higher. Accordingly, the cell having the threshold voltage adjusting patterns 22 and 24 as shown in FIG. 1 is the cell having MOS transistors with relatively high threshold voltages, and will be called as the "high threshold voltage cell". On the other hand, the cell having no threshold voltage adjusting patterns 22 and 24 is the cell having MOS transistors with relatively low threshold voltages, and will be called as the "low threshold voltage cell".

Figure 2:
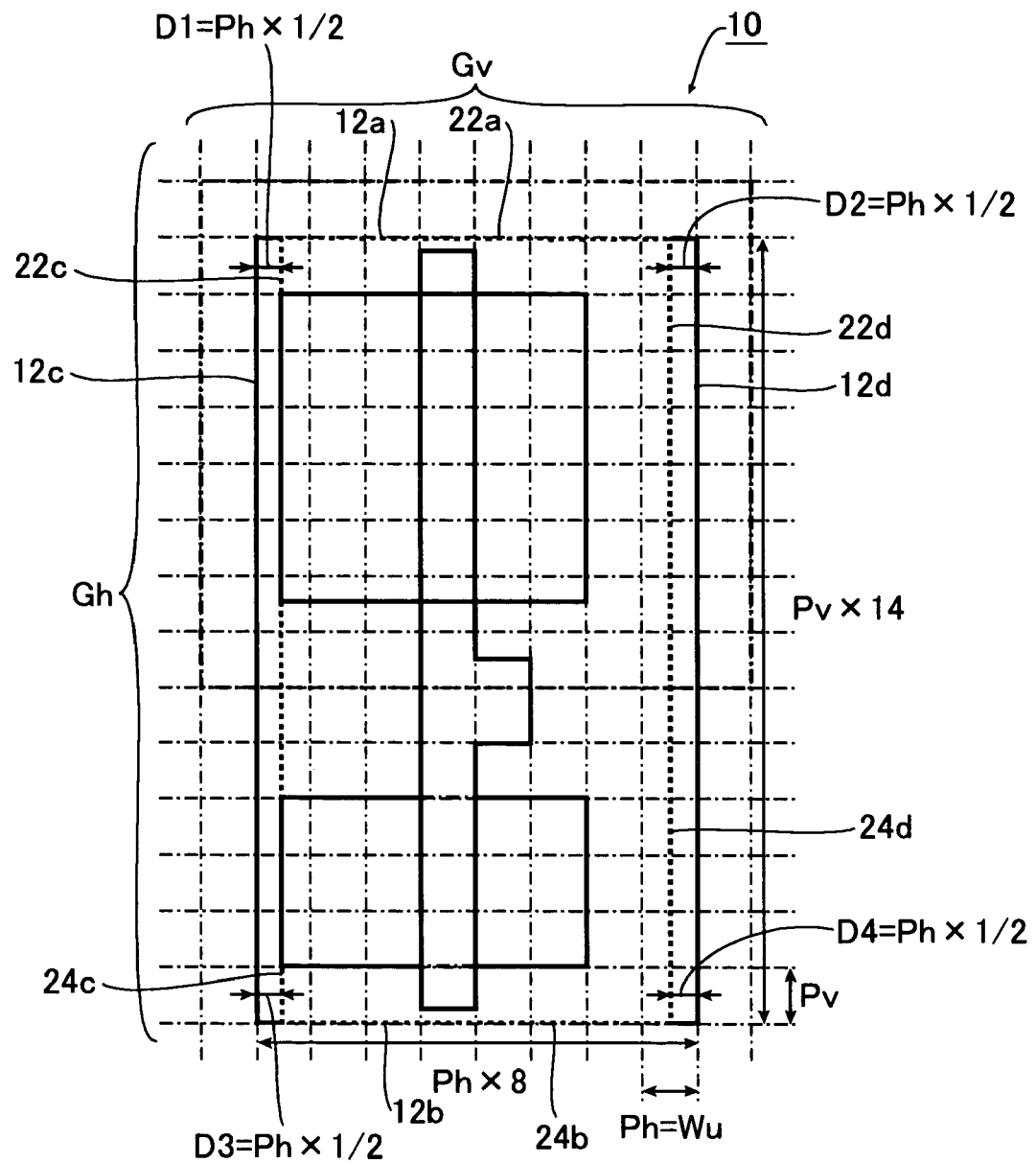
FIG. 2 is an exemplary layout diagram showing the state that the exemplary standard cell shown in FIG. 1 is placed along a placement grid.

According to an exemplary embodiment of a method of designing semiconductor integrated circuits according to this invention, a plurality of types of standard cells including the standard cell shown in FIG. 1 is arranged, or placed along the arrangement grids in vertical and horizontal directions. FIG. 2 is a layout diagram showing an exemplary state that the exemplary standard cell shown in FIG. 1 is placed along the horizontal placement grid Gh and the vertical placement grid Gv.

As shown in FIG. 2, the standard cell 10 is placed such that the upper, lower, left, and right boundaries of the cell frame are aligned with the vertical and horizontal grids. The height of the standard cell 10 (the distance between the upper and the lower boundaries 12a and 12b of the cell frame 12) is equal to an integer (14 in the example shown in FIG. 2) times the vertical pitch Pv of the placement grid. The width of the standard cell 10 (the distance between the left and right boundaries 12c and 12d of the cell frame 12) is equal to an integer (8 in the example shown in FIG. 2) times the horizontal pitch Ph of the placement grid.

Moreover, in the example shown in FIG. 2, the distance (D1) between the left boundary 22c of the first threshold voltage adjusting pattern 22 and the left boundary 12c of the cell frame 12, the distance (D2) between the right boundary 22d of the first threshold voltage adjusting pattern 22 and the right boundary 12d of the cell frame 12, the distance (D3) between the left boundary 24c of the second threshold voltage adjusting pattern 24 and the left boundary 12c of the cell frame 12, and the distance (D4) between the right boundary 24d of the second threshold voltage adjusting pattern 24 and the right boundary 12d of the cell frame 12 of the exemplary standard cell 10 are all identical with each others, and are equal to ½ times the horizontal pitch Ph of the placement grid.

According to an exemplary cell library of this invention, the distances D1, D2, D3, and D4 among the plurality of types of prepared standard cells are kept in a certain relationship. Accordingly, situations that the design rule violation occurs between the threshold voltage adjusting patterns of the standard cells, which are placed adjacently with each other in the vertical direction, is specified so that the violation can be easily resolved.

Figure 3:
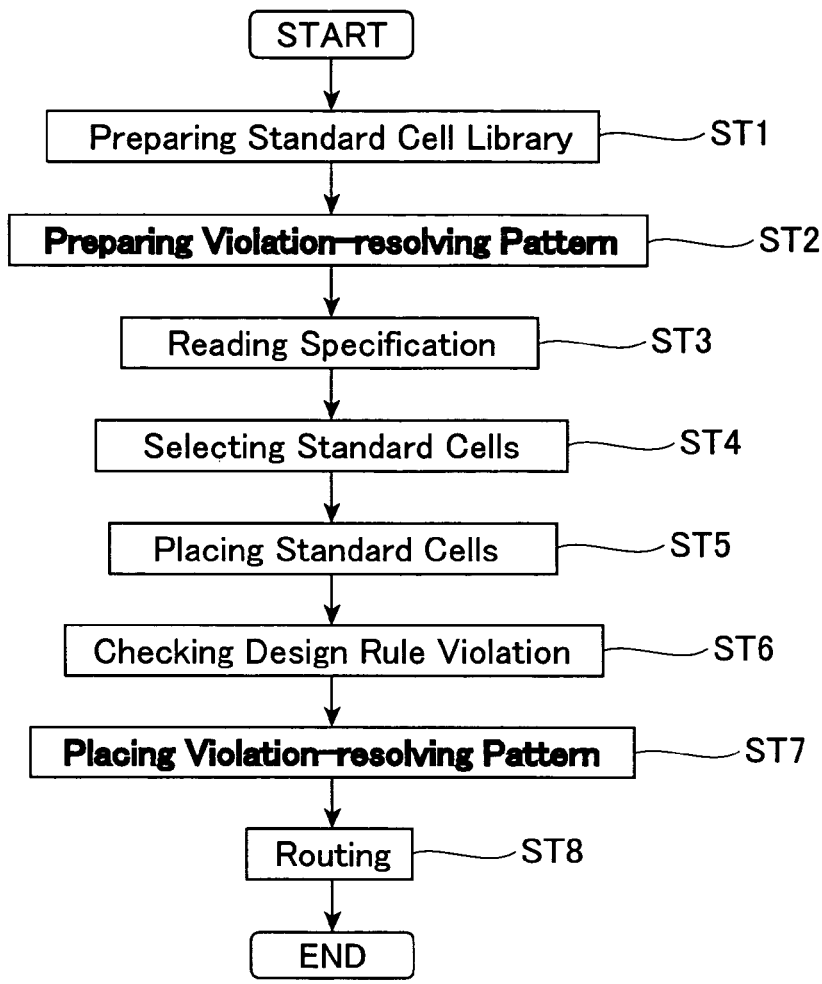
FIG. 3 is a flow diagram showing an exemplary method of designing a semiconductor integrated circuit according to this invention.

FIG. 3 is a flowchart showing an exemplary embodiment of a method of designing semiconductor integrated circuit according to this invention. The steps of "Preparing Violation-resolving Pattern" and "Placing Violation-resolving Pattern," which are written in boldfaces in FIG. 3 are not included in the conventional method of the designing semiconductor integrated circuit.

Firstly, the standard cell library for use in designing a semiconductor integrated circuit is prepared. That is, including the exemplary standard cell 10 shown in FIG. 1, a plurality of types of standard cells including various patterns for realizing various functions is prepared, and registered in the library (ST1).

Next, a specification required for the semiconductor integrated circuit is read as a form of, for example, a net list (ST3), and a plurality of types of standard cells (a first plurality of types of standard cells) required to meet the specification is selected from the plurality of types of standard cells prepared in the library (ST4). Then, necessary number of standard cells of each selected types of standard cells is placed along the placement grid (ST5). Thereby, a circuit block in which a plurality of types of standard cells is placed in vertical and horizontal directions is formed.

Thereafter, a check is made if there are portions in the circuit block thus formed where various rules, which are set in the design rule, are violated (ST6). If there is no violation, wirings are placed also along the placement grid in order to connect between the standard cells (ST8). Thereby, a semiconductor integrated circuit pattern including one or a plurality of circuit blocks required to meet the specification is formed.

The steps thus explained may be performed using a known CAD system. That is, the cell library prepared in step ST1 may be provided in a storage of the CAD system, and the semiconductor integrated circuit pattern may be formed as a computer readable data that is stored in the storage of the CAD system. Further, masks of respective layers may be formed according to the data of the semiconductor integrated circuit pattern thus formed, and a semiconductor integrated circuit may be formed on a semiconductor substrate using the masks thus formed. As a result, a semiconductor integrated circuit, in which the semiconductor integrated circuit pattern designed by the steps shown in FIG. 3 is formed on a semiconductor substrate, is manufactured Accordingly, the semiconductor integrated circuit pattern according to an exemplary embodiment of this invention may be realized as the logical pattern in a storage of a CAD system, and may be also realized as the physical pattern within a semiconductor integrated circuit formed on a semiconductor substrate.

Figure 4:
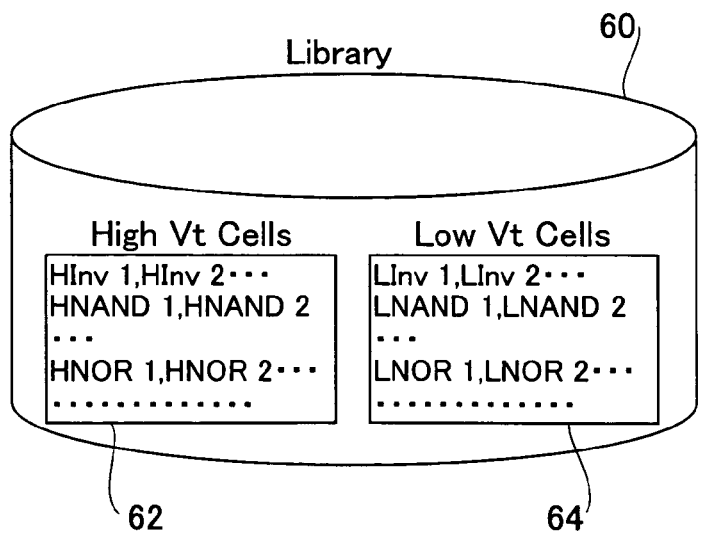
FIG. 4 is a schematic diagram of an exemplary cell library according to an embodiment of this invention.

FIG. 4 is a schematic drawing showing a construction of an exemplary embodiment of the cell library according to this invention, which is prepared in step ST1 of the exemplary method of designing shown in FIG. 3. Respective pluralities of types of high threshold voltage cells 62 and low threshold voltage cells 64 are registered in the cell library 60. As the plurality of types of high threshold voltage cells, the cell 10 has the function of an inverter as shown in FIG. 1, and various other cells have functions of NAND, NOR and so on. Further, for each of the functions, a plurality of cells having different driving capabilities is registered. These cells with different driving capabilities have different widths of the cell frames.

Similarly, as the plurality of types of low threshold voltage cells, a plurality of types of cells having various functions of an inverter, NAND, NOR and so on, and various driving capabilities are registered. At least some of the low threshold voltage cells and corresponding ones of the high threshold voltage cells include the same patterns arranged in respective cell frames with the same size, except that the low threshold voltage cells do not include first and the second threshold voltage adjusting patterns. Due to the difference in the threshold voltages of transistors, however, a low threshold voltage cell and a corresponding high threshold voltage cells have different operation speeds and leakage currents.

According to the exemplary embodiment, each of the high threshold voltage cells included in the cell library 60 has first and second threshold voltage adjusting patterns, same as the exemplary standard cell 10 shown in FIGS. 1 and 2. Further, the layout of the threshold voltage adjusting patterns is the same as that in the exemplary standard cell 10. That is, the upper boundary 22a of the first threshold voltage adjusting pattern 22 and the lower boundary 24b of the second threshold voltage adjusting pattern 24 contact the upper boundary 12a and the lower boundary 12b, respectively, of the cell frame. All of the distances D1, D2, D3, and D4 between the left and right boundaries 22c, 22d, 24c, and 24d of the first and the second threshold voltage adjusting patterns 22 and 24 and the left and right boundaries 12c and 12d of the cell frame are equal to ½ times the horizontal pitch Ph of the placement grid.

Keeping the layouts of the threshold voltage adjusting patterns in a plurality of types of high threshold voltage cells included in the cell library enables to specify the situation that a design rule violation occurs and make it easy to resolve the violation. However, regarding the distances between the left and right boundaries of the threshold voltage adjusting patterns and the left and right boundaries of the cell frame, the distances D1, D2, D3 and D4 are not necessarily required to be fixed to the same value, although they are required to meet a certain rule.

Figure 5:
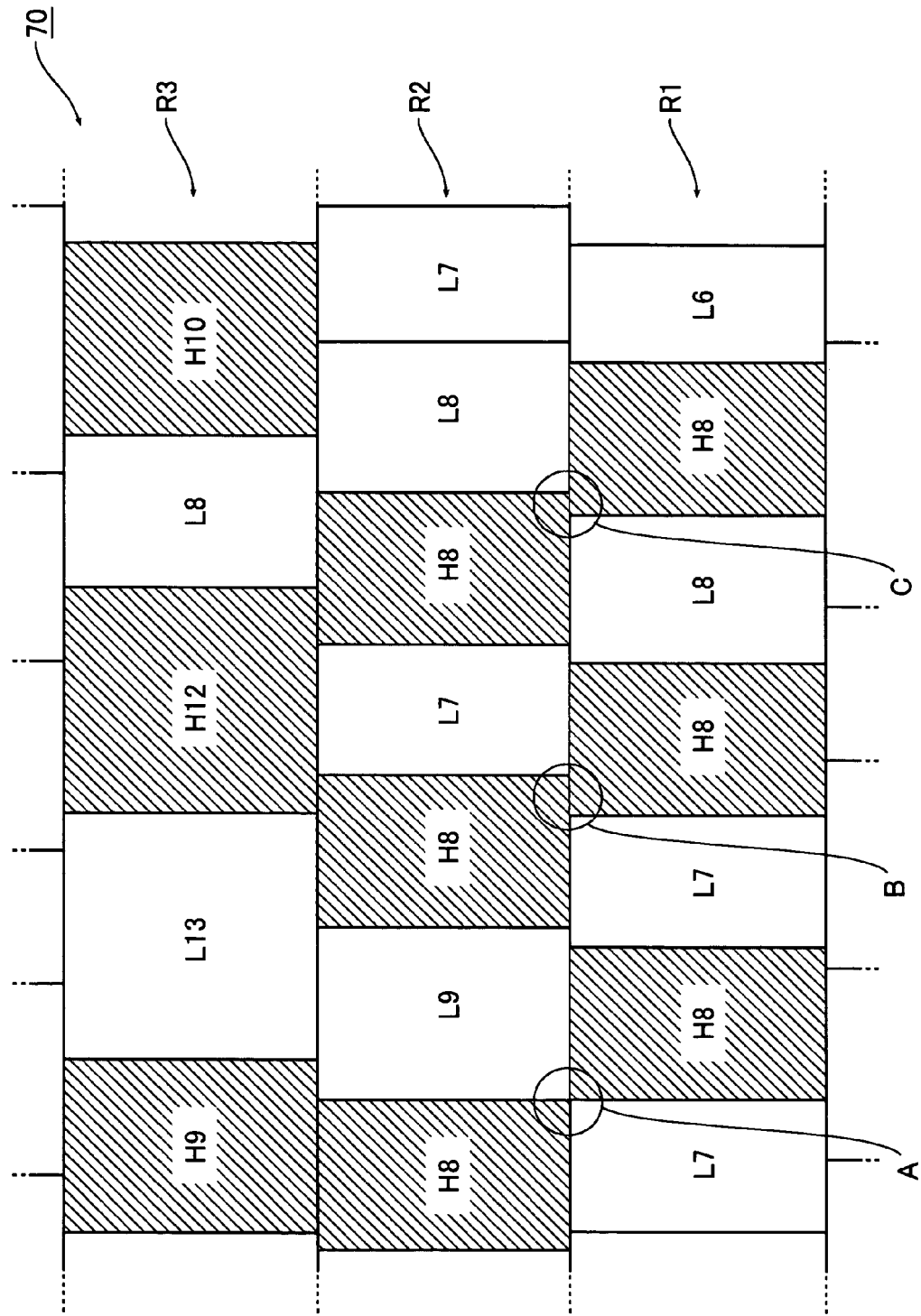
FIG. 5 is an exemplary layout diagram schematically showing an exemplary circuit block included in a semiconductor integrated circuit pattern according to this invention.

FIG. 5 is a layout diagram that schematically shows an exemplary circuit block 70 formed by placing a plurality of types of standard cells, which includes the standard cell 10 shown in FIG. 1 and other standard cells. This circuit block 70 is an example of the circuit block that is included in the semiconductor integrated circuit pattern according to this invention. Also, FIG. 5 is a layout diagram that shows an exemplary circuit block included in the semiconductor integrated circuit pattern formed on a semiconductor substrate in the semiconductor integrated circuit according to this invention.

In FIG. 5, the high threshold voltage cell 10 shown in FIG. 1, having a cell frame width of 8 times the horizontal pitch Ph of the placement grid is marked as "H8". Similarly, high threshold voltage cells having cell frame widths of 9, 10 and 12 times Ph are marked as "H 9", "H10", and "H12", respectively. On the other hand, low threshold voltage cells with the cell widths of 6, 7, 8, 9 and 13 times Ph are marked as "L6", "L7", "L8", "L9", and "L13", respectively. Although not shown in FIG. 5, these standard cells are placed along placing grids Gh and Gv, which are shown in FIG. 2. That is, each of the standard cells is placed such that the upper, lower, left, and right boundaries of the cell frame are aligned with the placing grids.

More specifically, a plurality of standard cells are placed such that left and right boundaries of the cell frames contact with each other in the horizontal direction in FIG. 5 thereby forming standard cell rows R1, R2, R3 . . . . These standard cell rows R1, R2, R3 . . . are placed such that upper and lower boundaries of the cell frames of the standard cells included in respective standard cell rows contact with each other thereby forming the circuit block 70. The standard cells are placed while alternately flipping in the vertical direction. That is, the standard cells in the odd-numbered rows R1, R3 . . . are each placed with a layout that the N-well 14 is arranged on the upper side, as shown in, for example, FIG. 1. On the other hand, the standard cells in the even-numbered rows R2 . . . are each placed with a layout that the N-well 14 is arranged on the lower side, which is a flipped layout of the one such as shown in FIG. 1.

In the circuit block 70 thus formed, two of the standard cells placed adjacently with each other in the vertical direction take one of the following three positional relationships between them:

(1) the frames of the two standard cells contact with each other at their corners (for example, position A in FIG. 5);
(2) the frames of the two standard cells contact with each other along a width of 2 times the horizontal pitch of the placement grid Ph, or more (for example, position B in FIG. 5); or
(3) the frames of the two cells contacts with each other along a width equal to the horizontal pitch of the placement grid Ph (for example, portion C in FIG. 5).

In the exemplary high threshold voltage cell 10 shown in FIG. 2, the upper boundary 22a of the first threshold voltage adjusting pattern 22 and the lower boundary 24b of the second threshold voltage adjusting pattern 24 contact the upper and lower boundaries 12a, 12b of the cell frame 12, respectively. Moreover, the distances D1, D2, D3, and D4 between the left and right boundaries 22c, 22d, 24c, and 24d of the first and the second threshold voltage adjusting patterns 22 and 24 and the left and the right boundaries 12a, 12b of the cell frame 12 are all equal to ½ times the horizontal pitch Ph of the placement grid. When the high threshold voltage cells having such a layout of the threshold voltage adjusting patterns are placed, no design rule violation occurs between the threshold voltage adjusting patterns of the high threshold voltage cells, which are adjacent with each other in the vertical direction, in the situations (1) and (2) explained above. On the other hand, in the situation (3), a design rule violation occurs between the threshold voltage adjusting patterns of the high threshold voltage cells that are adjacent with each other in the vertical direction, but the violation can be resolved with a simple procedure.

Each of these situations will be explained with reference to FIGS. 6, 7, 8, and 9, respectively. Note that FIG. 5 shows a case that the same high threshold voltage cells 10 are placed adjacently in the vertical direction. Similarly, cases that the same high threshold voltage cells 10 (marked as "H8" in FIG. 5) are placed adjacently in the vertical direction will be explained in FIGS. 6, 7, 8, and 9. In the exemplary cell library 60 according to this embodiment, however, the layout of the threshold voltage adjusting patterns in other high threshold voltage cells are the same as the case in the exemplary high threshold voltage cell 10 shown in FIG. 2. Accordingly, the positional relationships between the threshold voltage adjusting patterns are the same when other types of high threshold voltage cells are placed adjacently in the vertical direction, or high threshold voltage cells of mutually different types are placed adjacently in the vertical direction.

Figure 6:
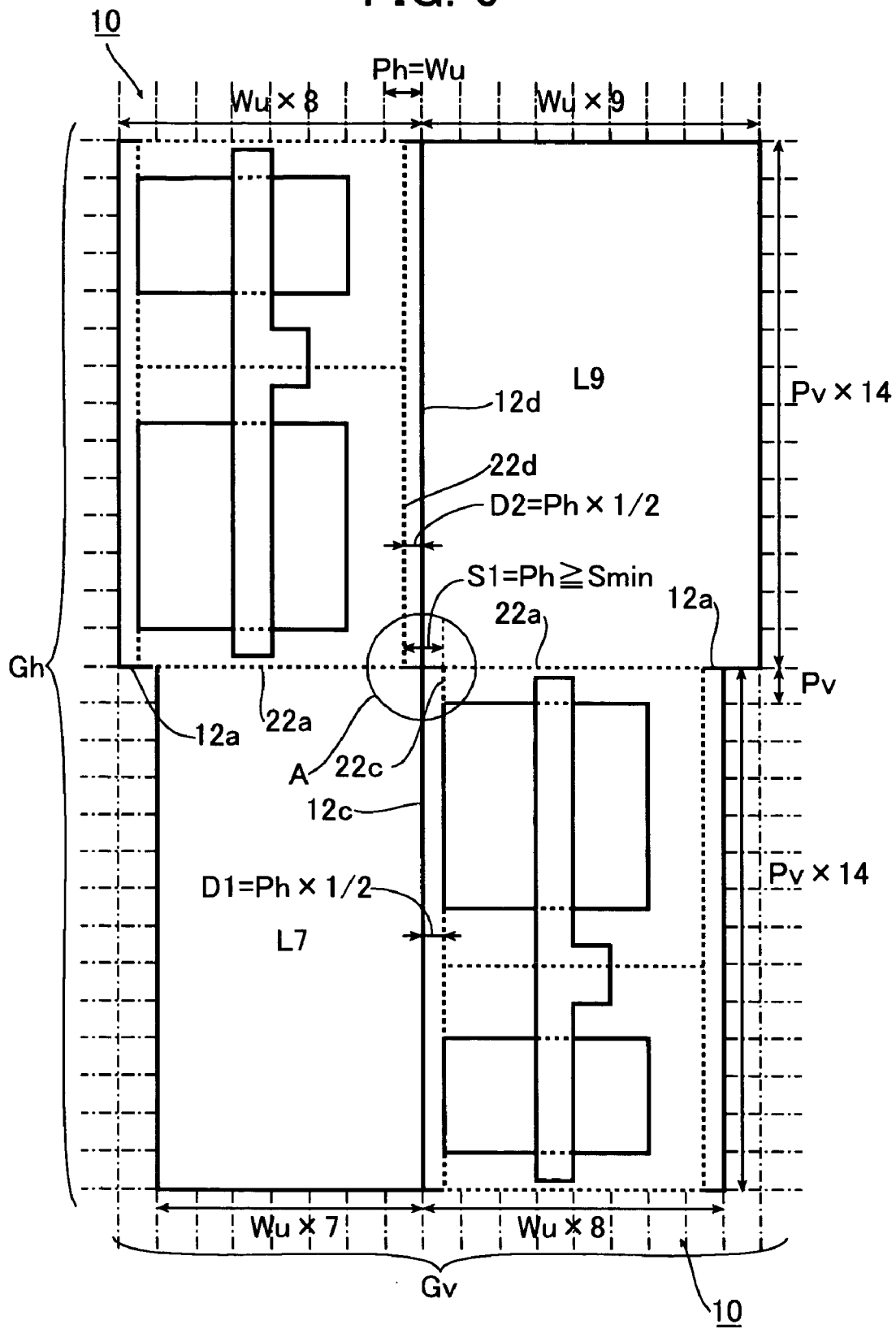
FIG. 6 is an exemplary layout diagram showing a layout of exemplary standard cells around position A shown in FIG. 5.

FIG. 6 is a layout diagram showing the layout of standard cells around position A shown in FIG. 5.

Shown on the lower right and the upper left sides of FIG. 6 are two high threshold voltage cells 10 placed with corners of their cell frames contacting with each other at position A. Among them, the high threshold voltage cell 10 on the lower right side is placed with the layout shown in FIG. 1. On the other hand, the high threshold voltage cell 10 on the upper left side is placed with a layout flipped in the vertical direction from that shown in FIG. 1. On the lower left and the upper right sides of FIG. 6, two low threshold voltage cells L7 and L9 are placed with corners of their cell frames contacting with each other at position A. In FIG. 6, only the cell frames of these low threshold voltage cells are shown and the patterns within the cell frames are not shown.

Placement grids Gh and Gv, along which the cells are placed, are also shown in FIG. 6. For clarity, however, the placement grids are shown only on outside of the area that the four cells are shown.

As shown in FIG. 2, in the exemplary standard cell 10, each of the distances D1 and D2 between the left and right boundaries 22c, 22d of the first threshold voltage adjusting pattern 22 and the left and right boundaries 12c, 12d of the cell frame 12 is ½ times the horizontal pitch Ph of the placement grid. Accordingly, when the high threshold voltage cells 10 placed adjacently in the vertical direction contact at corners of their cell frames, a space S1 equal to the horizontal pitch Ph of the placement grid is formed between the first threshold voltage adjusting patterns 22 of the cells placed adjacently in the vertical direction.

In a 130 nm-node semiconductor integrated circuit, the minimum allowable space Smin between the first threshold voltage adjusting patterns set by the design rule is, for example, 0.31 μm. The horizontal pitch Ph of the placement grid is, for example, 0.41 μm. Thus, the horizontal pitch Ph of the placement grid and the minimum space Smin has a relationship of Ph≧Smin. Accordingly, no violation of the design rule occurs between the first threshold voltage adjusting patterns 22.

Around position A in FIG. 5, the standard cell 10 having a layout flipped in the vertical direction from that shown in FIG. 1 is placed adjacently on the upper side of the same standard cell 10 having the layout shown in FIG. 1. Accordingly, as shown in FIG. 6, the first threshold voltage adjusting patterns 22 of the standard cells 10, which are placed adjacently in the vertical direction, are placed adjacently with each other. When the standard cell 10 having the layout shown in FIG. 1 is placed adjacently on the upper side of the same standard cell 10 having a layout vertically flipped from that shown in FIG. 1, on the other hand, the second threshold voltage adjusting patterns 24 are placed adjacently with each other in the vertical direction.

In the exemplary high threshold voltage cell 10 shown in FIG. 2, distances D3 and D4 between the left and right boundaries 24c, 24d of the second threshold voltage adjusting pattern 24 and the left and right boundaries 12c, 12d of the cell frame 12 are also ½times Ph. Accordingly, also when the second threshold voltage adjusting patterns of the standard cells, which are placed adjacently in the vertical direction with corners of their cell frames contact with each other, are placed adjacently with each other, a space of Ph is formed between them.

The same minimum space, which is allowed between the first threshold voltage adjusting patterns, is usually allowed between the second threshold voltage adjusting patterns. Accordingly, no violation of the design rule occurs when the second threshold voltage adjusting patterns 24 of the standard cells, which are placed adjacently in the vertical direction with their corners of their cell frames contacting with each other, are placed adjacently with each other.

Various values set by the design rule vary depending on the manufacturing process to be used. However, the pitch Ph of the placement grid is usually set to be equal to or larger than the minimum allowable space between the threshold voltage adjusting patterns (when it is set differently for each of the first and the second threshold voltage adjusting patterns, the larger one of them) Smin. Accordingly, as shown in FIG. 6, a space S1 that is equal to or larger than the minimum allowable space set by the design rule is formed between the first or the second threshold voltage adjusting patterns of the cells, which are placed adjacently in the vertical direction contacting with each other at a corner point of their cell frames.

With reference to FIG. 6, the relationship between dimensions of the cell frames of the plurality of types of standard cells, which are included in the exemplary standard cell library according to this embodiment, and the pitch of the placement grid will be further explained.

As previously explained, the plurality of types of standard cells included in the exemplary standard cell library has the same height. Specifically, in the example shown in FIG. 6, the standard cells have the same height of 14 times the vertical pitch Pv of the placement grid. As also previously explained, the width of the plurality of types of standard cells is an integer (or more precisely, positive integer) times a unit width Wu. Specifically, the high threshold voltage cell 10 has a width of 8 times the unit width Wu, the low threshold voltage cells L7 and L9 have widths of 7 and 9 times Wu, respectively.

In the example shown in FIG. 6, the horizontal pitch Ph of the placement grid is equal to the unit width Wu of the standard cell. Accordingly, in the high threshold voltage cell 10, each of the distances D1, D2, D3, and D4 between left and right boundaries 22c, 22d of the first threshold voltage adjusting pattern 22 or left and right boundaries 24c, 24d of the second threshold voltage adjusting pattern 24 and left and right boundaries 12c, 12d of the cell frame 12 is ½ times the unit width Wu. Moreover, the unit width Wu is set to have a relationship of Wu≧Smin with the minimum allowable space Smin between the threshold voltage adjusting patterns set by the design rule.

Figure 7:
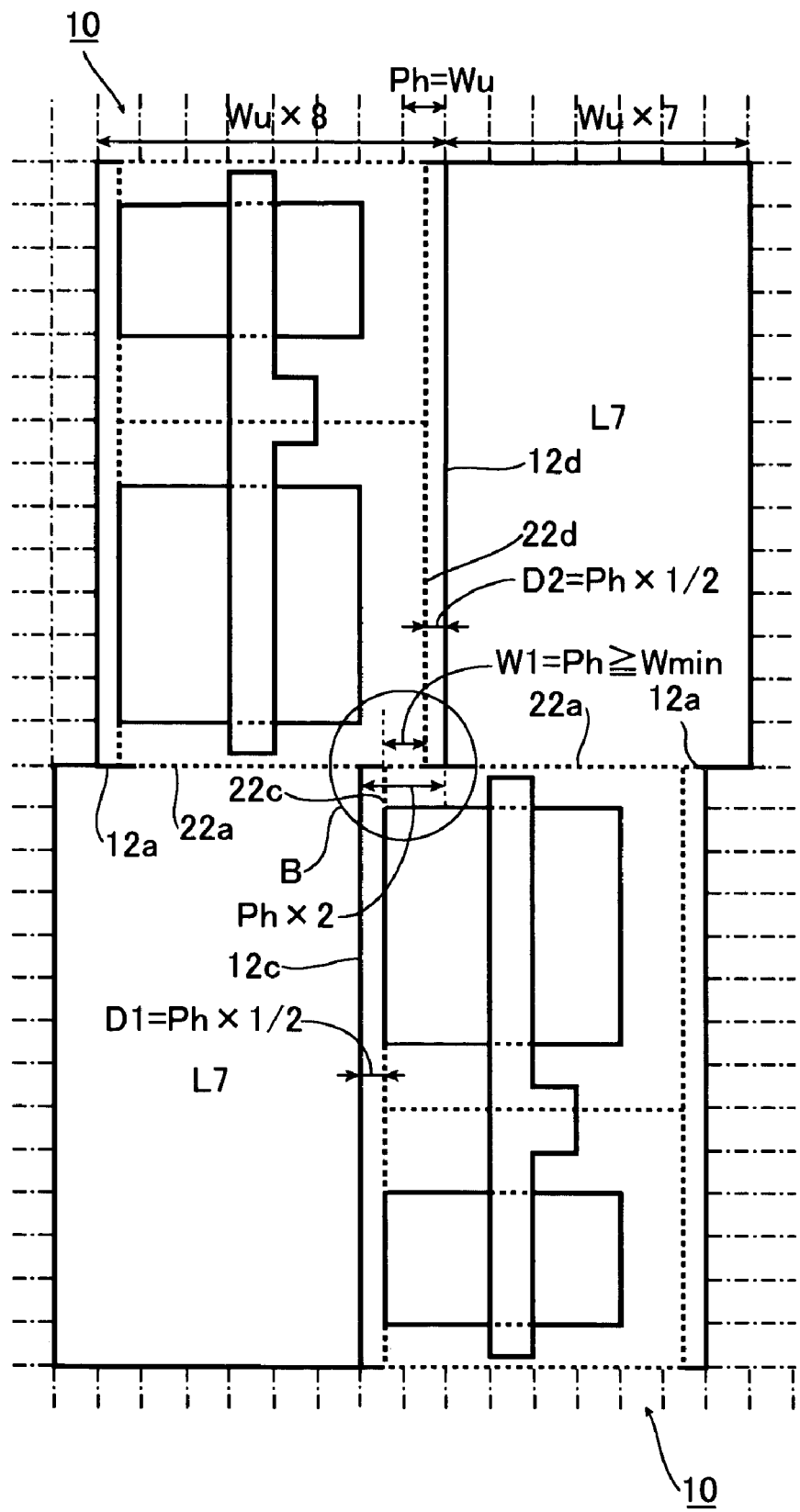
FIG. 7 is an exemplary layout diagram showing a layout of exemplary standard cells around position B shown in FIG. 5.

Next, FIG. 7 is a layout diagram showing an exemplary layout of the standard cells around position B shown in FIG. 5.

On the lower right and the upper left sides of FIG. 7, two high threshold voltage cells 10 are shown. These standard cells 10 are placed with boundaries of their cell frames contact with each other along a width of 2 times the horizontal pitch Ph of the placement grid. Among them, the high threshold voltage cell 10 on the lower right side is placed with the layout shown in FIG. 1. On the other hand, the high threshold voltage cell 10 on the upper left side is placed with a layout that is flipped in the vertical direction from that shown in FIG. 1. On the lower left and the upper right sides of FIG. 7, two low threshold voltage cells L7 having a width of 7 times the unit width Wu are placed. Same as the case of FIG. 6, only the cell frames of these low threshold voltage cells are shown, and the internal patterns are not shown.

In the exemplary high threshold voltage cell 10 included in the exemplary cell library 60 according to this embodiment, as shown in FIG. 2, the upper boundary 22a of the first threshold voltage adjusting pattern 22 contacts the upper boundary 12a of the cell frame 12. Accordingly, the upper boundaries 12a of the threshold voltage adjusting patterns 22 of vertically adjacent high threshold voltage cells 10 contact with each other, when the frames of the high threshold voltage cells 10 contact with each other along a width of 2 times the grid pitch Ph or more. The threshold voltage adjusting patterns 22 of the upper and the lower cells are merged at the portion where they are in contact with each other, and a small space that would violate the design is not formed between them.

Further, in the exemplary high threshold voltage cell 10 included in the exemplary cell library according to the embodiment, each of the distances D1 and D2 between the left and right boundaries 22c, 22d of the first threshold voltage adjusting pattern 22 and the left and right boundaries 12c, 12d of the cell frame 12 is ½ times the grid pitch Ph (or the unit width Wu of the standard cell). Accordingly, when the frames of vertically adjacent high threshold voltage cells 10 contact with each other along a width of 2 times the grid pitch Ph or more, the upper boundaries 12*a* of the threshold voltage adjusting pattern 22 of the vertically adjacent cells contact with each other along a width of W1 equal to or longer than the grid pitch Ph (or the unit width Wu). That is, at position B, the pattern formed by merging the threshold voltage adjusting patterns 22 of the vertically adjacent cells has a width equal to or larger than the grid pitch Ph (or the unit width Wu).

In a design rule of a 130 nm-node semiconductor integrated circuit, the minimum allowable widths Wmin for the first and the second threshold voltage adjusting patterns are usually set to be equal to each other, and are, for example, 0.31 μm. Accordingly, there exists a relationship of Ph≧Wmin (or Wu≧Wmin). Accordingly, the first threshold voltage adjusting patterns do not violate the design rule at position B.

Similarly, no violation of the design rule occurs at the position where the second threshold voltage adjusting patterns of vertically adjacent high threshold voltage cells are placed adjacently with each other, when the frames of the vertically adjacent high threshold voltage cells contact with each other along a width of 2 times the grid pitch Ph or more.

The values set in the design rule vary depending on the manufacturing process to be used. Usually, however, the grid pitch (or the unit width Wu) is set to be equal to or larger than the minimum allowable width of the threshold voltage adjusting pattern (when mutually different values are set for the first and the second threshold voltage adjusting patterns, the larger one of them) Wmin. Accordingly, design rule violation does not occur in either of the first and the second threshold voltage adjusting patterns at position B.

Figure 8:
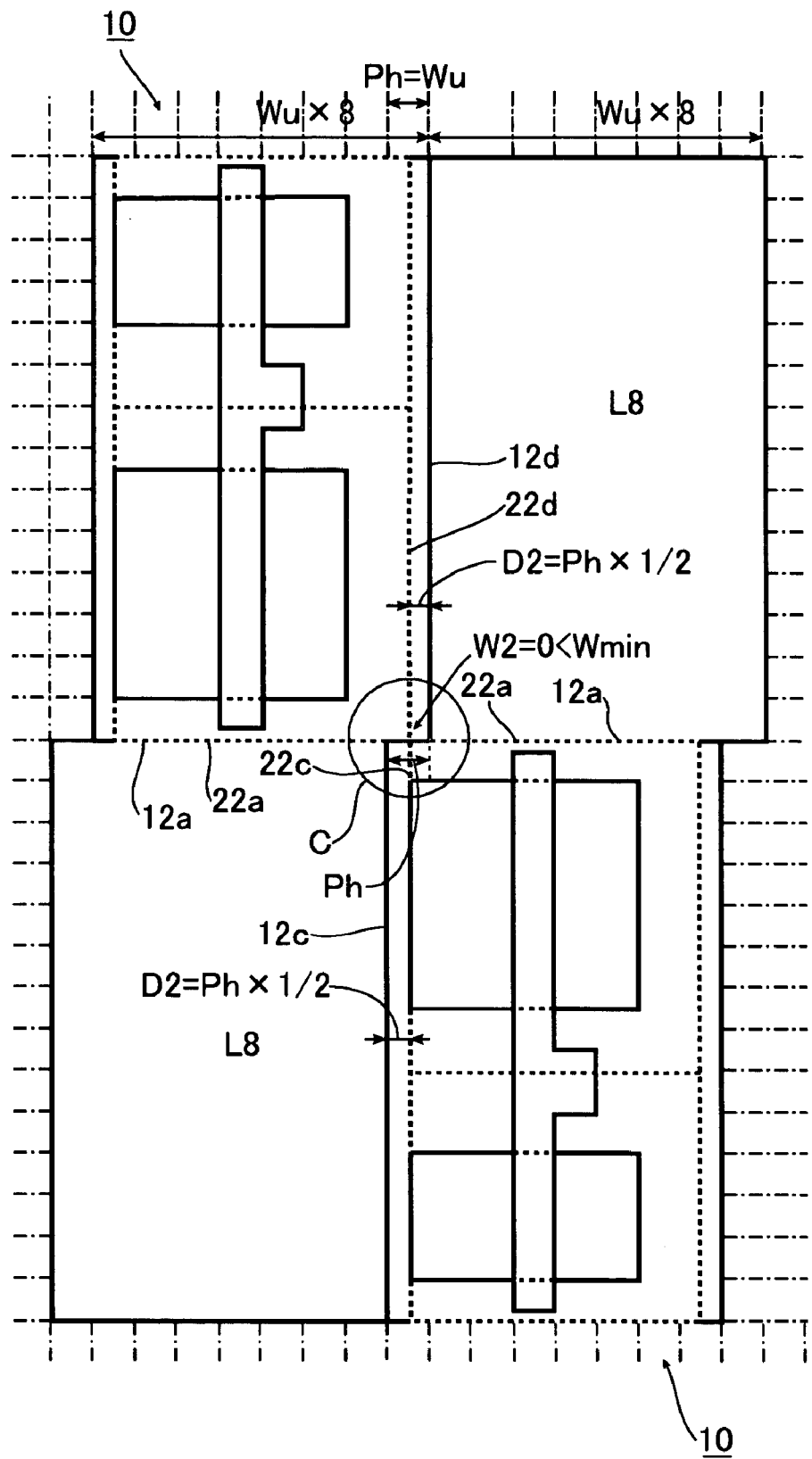
FIG. 8 is an exemplary layout diagram showing a layout of exemplary standard cells around position C shown in FIG. 5.

Further, FIG. 8 is a layout diagram showing the layout of the standard cells around position C shown in FIG. 5.

On the lower right and the upper left sides of FIG. 8, two high threshold voltage cells 10 are shown. These high threshold voltage cells are placed adjacently in the vertical direction with their cell frames contact with each other at position C along a width of the horizontal pitch Ph of the placement grid. Among them the high threshold voltage cell 10 on the lower right side is placed with the layout shown in FIG. 1. On the other hand, the high threshold voltage cell 10 on the upper left side is placed with a layout flipped in the vertical direction from that shown in FIG. 1. On the lower left and the upper right sides of FIG. 8, two low threshold voltage cells L8 having a width of 8 times the unit width Wu are placed. Similar to FIGS. 6 and 7, only the cell frames of these low threshold voltage cells are shown and the internal patterns are not shown.

As shown in FIG. 2, in the exemplary high threshold voltage cell 10 included in the exemplary cell library according to this embodiment, the upper boundary 22*a* of the first threshold voltage adjusting pattern 22 contacts the upper boundary 12*a* of the cell frame 12. Further, each of the distances D1 and D2 between the left and right boundaries 22*c*, 22*d* of the first threshold voltage adjusting pattern 22 and the left and the right boundaries 12*c*, 12*d* of the cell frame 12 is ½ times the horizontal pitch Ph of the placement grid (or the unit width Wu of the standard cell). Accordingly, when the cell frames of vertically adjacent high threshold voltage cells 10 contact with each other along a width of the grid pitch Ph, the first threshold voltage adjusting patterns 22 of the vertically adjacent high threshold voltage cells contact with each other at a point of their corners. That is, at position C, the horizontal width W2 between the two contacting corner points of the respective first threshold voltage adjusting patterns 22 is 0.

The width W2 is less than the minimum allowable width Wmin, and thus a design rule violation occurs. When forming a resist pattern using a mask having mask patterns corresponding to the threshold voltage adjusting patterns, an abnormal formation of the resist pattern may occur at the position corresponding to position C. As a result, adjustment of the threshold voltage using the resist pattern may be disturbed. However, the design rule violation that occurs at position C may be easily resolved by a procedure shown in FIG. 3.

Returning to FIG. 3, an exemplary method of designing according to this embodiment will be further explained. As shown with the bold letters in FIG. 3, in the exemplary method of designing semiconductor integrated circuit pattern according to this embodiment, a violation-resolving pattern for resolving design rule violations is prepared beforehand (ST2). The violation-resolving pattern prepared in ST2 is placed (ST7) at positions where the violation is found by a design rule checking step (ST6), i.e., at position C shown in FIG. 8.

According to this exemplary embodiment, the position where the design rule violation occurs is limited to position C. Furthermore, the situation of the occurrence of design rule violation (the dimension of a width or a space, which does not meet the design rule, formed at the position of violation) is the same. Accordingly, in step ST2 for preparing the violation-resolving pattern, it is enough to prepare only one type of violation-resolving pattern having the same shape and the dimension for each of the first and the second threshold voltage adjusting patterns.

Figure 9:
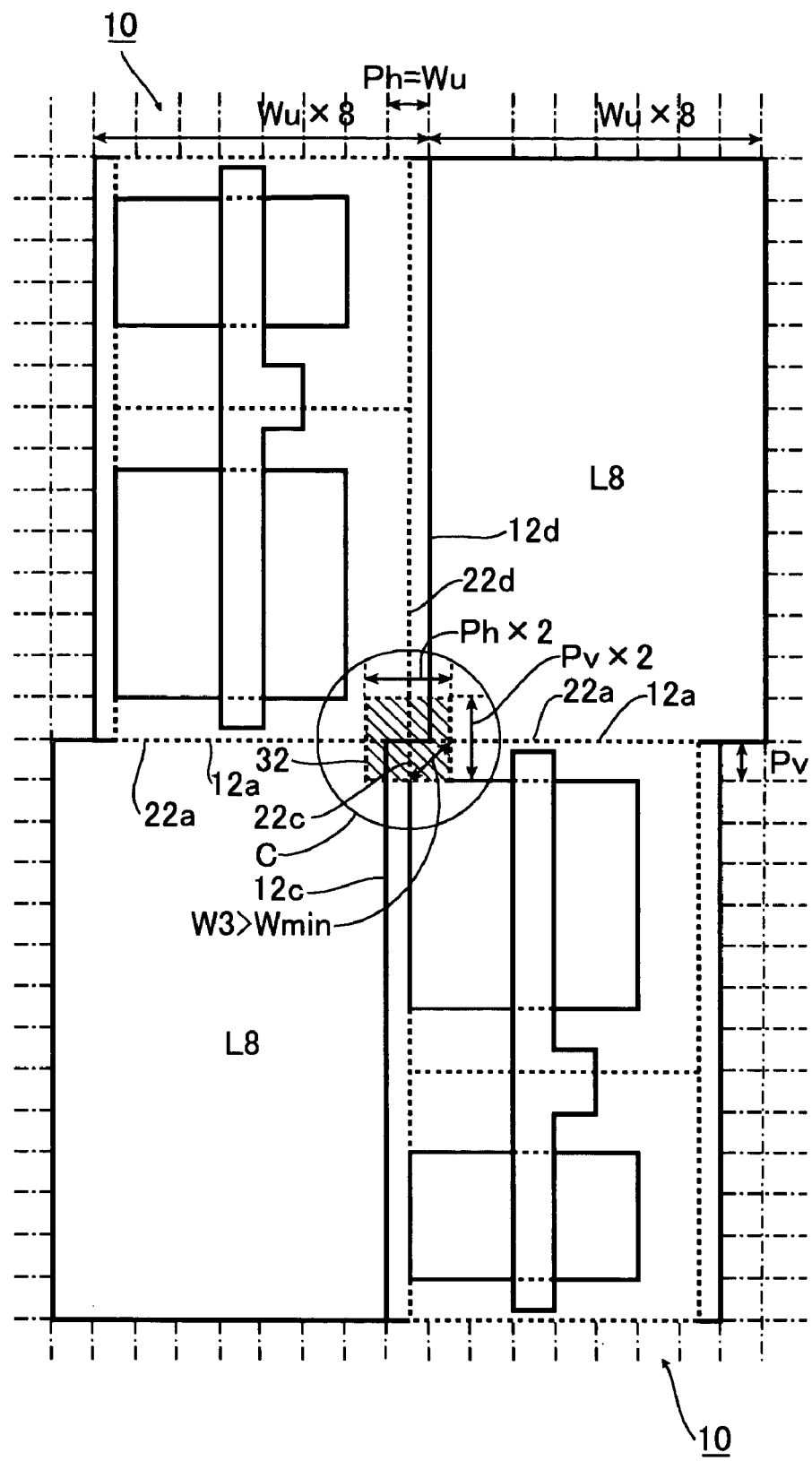
FIG. 9 is an exemplary layout diagram showing a situation where a violation-resolving pattern is placed at position C shown in FIG. 8.

FIG. 9 is an exemplary layout diagram showing the situation that the violation-resolving pattern is placed at position C shown in FIG. 8.

In the example shown in the figure, the violation-resolving pattern 32 is a rectangle (or a square when Pv=Ph) having vertical and horizontal sides. The lengths of the sides are 2 times the vertical and the horizontal grid pitches Pv and Ph, respectively. The violation-resolving pattern 32 is placed with its center positioned at the point where the corners of the threshold voltage adjusting patterns of the vertically adjacent cells contact with each other, and with their sides parallel to the horizontal and vertical grids.

In the exemplary layout data, the violation-resolving pattern 32 is merged with threshold voltage adjusting patterns 22 of the adjacently placed two high threshold voltage cells 10. That is, the threshold voltage adjusting patterns 22 of the adjacent high threshold voltage cells 10 and the violation-resolving pattern 32 are merged to form an unitary pattern. The minimum width (the length of the arrow W3 shown in FIG. 9) of the merged pattern near position C is $Ph \times \sqrt{2} \cong Ph \times 1.4$. This value is larger than the minimum allowable width Wmin set by the design rule. Thus, the design rule violation is resolved. Accordingly, when forming the resist pattern using a mask having mask patterns corresponding to the threshold voltage adjusting patterns, no abnormal formation of the resist pattern occurs.

Also in the case that the second threshold voltage adjusting patterns of high threshold voltage cells, which are placed adjacently in the vertical direction with their cell frames in contact with each other along a width of the grid pitch Ph, are placed adjacently in the vertical direction, similarly, the same situation occurs. That is, the second threshold voltage adjusting patterns of the vertically adjacent high threshold voltage cells contact with each other at a point of their corners. Thus, the design rule violation occurs. Also in this case that the design rule violation occurs between the second threshold voltage adjusting patterns, the violation may be easily resolved by the same procedure.

Among the steps shown in FIG. 3, checking design rule violation in ST6 has been performed conventionally. On the other hand, placing the violation-resolving pattern 32 in ST7 is a step that has been newly added in view of the placing of the cells having transistors with different threshold voltages. However, the actually performed procedure in this step (ST7) is just to place the violation-resolving pattern 32, which is prepared beforehand, at each of the positions where the design rule violation occurs. That is, neither of generating a violation-resolving pattern that fits the pattern shape of each of the places of design rule violation, nor adjusting the position of placing the generated pattern is required. Accordingly, addition of step ST7 does not significantly increase the time and the cost of designing.

Moreover, in the plurality of types of high threshold voltage standard cells included in the exemplary cell library according to this embodiment, the positional relationship between the threshold voltage adjusting patterns is the same not only when the exemplary high threshold voltage cells 10 shown in FIG. 1 are placed adjacently in the vertical direction, but also when other types of high threshold voltage cells or mutually different types of standard cells are placed adjacently in the vertical direction. That is, when two high threshold voltage cells are placed adjacently in the vertical direction with their cell frames contact with each other along a width of the grid pitch Ph, the threshold voltage adjusting patterns contact with each other at a point of their corners. Furthermore, the design rule violation that occurs in thus placed threshold voltage adjusting patterns of the high threshold voltage cells may be resolves by the same procedure, i.e., by placing the same violation-resolving pattern at the same position (such that its center is positioned at the corner that the threshold voltage adjusting patterns contact with each other).

The mathematical operation required to perform such a procedure is small. Accordingly, the addition of such a procedure does not significantly increase the time and cost required for designing semiconductor integrated circuit patterns.

Note that, it is not indispensable for this invention that the violation-resolving pattern 32 is a square having sides with lengths of 2 times the grid pitches Pv and Ph. The dimension of the violation-resolving pattern may be made smaller as long as the design rule violation can be resolved. Specifically, the violation-resolving pattern may be made smaller as long as the width W3 shown by the arrow in FIG. 9 is not smaller than the minimum allowable width Wmin set by the design rule.

On the other hand, for example, when a high threshold voltage cell is also placed on the lower left side of position C shown in FIG. 5, it is desirable that the size of the violation-resolving pattern 32 in the horizontal direction is equal to 2 time the gird pitch Ph or more for resolving the design rule violation.

Figure 10:
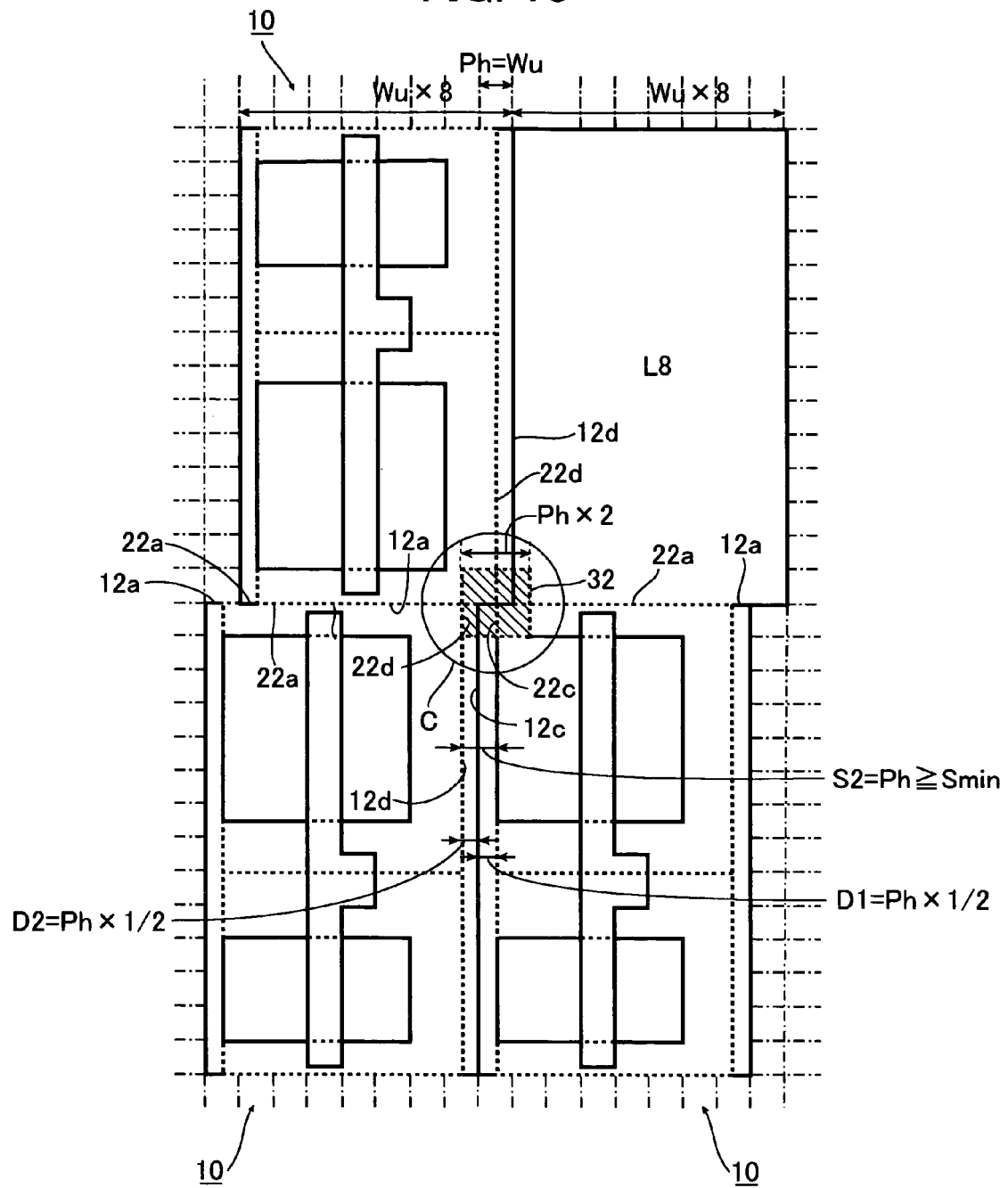
FIG. 10 is an exemplary layout diagram showing another layout of exemplary standard cells around position C shown in FIG. 5.

FIG. 10 is a layout diagram showing an exemplary layout around position C when the high threshold voltage cell 10 is also placed on the lower left side.

On the lower right and the upper left sides of FIG. 10, same as FIG. 8, two high threshold voltage cells 10 are shown. These high threshold voltage cells 10 are placed adjacently in the vertical direction with their cell frames contacting along a width of the horizontal pitch Ph of the placement grid. Furthermore, in FIG. 10, the same high threshold voltage cell 10 is also placed on the lower left side. As shown in FIG. 2, in the exemplary standard cell 10 included in the exemplary cell library according to this embodiment, each of the distances between the left and right boundaries 22c, 22d of the first threshold voltage adjusting pattern 22 and the left and the right boundaries 12c, 12d of the cell frame is ½ times the grid pitch Ph. Accordingly, a space S2 equal to the grid pitch Ph is formed between the first threshold voltage adjusting patterns 22 of the two high threshold voltage cells 10, which are placed adjacently in the horizontal direction on the lower side of FIG. 10. This space is equal to or larger than the minimum allowable space Smin set by the design rule, and meets the design rule.

Here, if the horizontal dimension of the violation-resolving pattern 32 to be placed at position C is inadequate, a small space remains between the threshold voltage adjusting pattern 22 of the high threshold voltage cell 10 placed on the lower left side of the figure and the violation-resolving pattern 32. In this case, a design rule violation occurs.

In FIG. 10, actually, the violation-resolving pattern 32 has a lateral dimension of 2 times Ph. The violation-resolving pattern 32 is placed such that the center thereof is positioned at the point where the corners of the first threshold voltage adjusting patterns 22 of the two high threshold voltage cells 10, which are placed on the lower right and the upper left sides of the drawing, contacting with each other. Accordingly, the space S2 between the first threshold voltage adjusting patterns 22 of the two high threshold voltage cells 10, which are placed adjacently in the horizontal direction on the lower side of the drawing, is just filled by the violation-resolving pattern 32. Thus, no small space that generates a design rule violation remains between the threshold voltage adjusting patterns 22 of the high threshold voltage cells 10 that are placed adjacently in the horizontal direction.

As explained above, when two high threshold voltage cells are further placed adjacently in the horizontal direction at position C where the threshold voltage adjusting patterns of two high threshold voltage cells, which are placed adjacently in the vertical direction, contacts with each other at their corners and a design rule violation occurs, it is preferable to make the lateral dimension of the violation-resolving pattern 32 equal to 2 time the grid pitch Ph or more.

So far, a cell library, a method of designing semiconductor integrated circuit, a semiconductor integrated circuit pattern, and a semiconductor integrated circuit according to this invention are explained with reference to an exemplary embodiment. In the exemplary embodiment explained above, all the distances D1, D2, D3, and D4 between the left and right boundaries of the first and the second threshold voltage adjusting patterns and the left and right boundaries of the cell frames of the plurality of types of high threshold voltage cells included in the exemplary cell library are the same. That is, all of the distances D1, D2, D3, and D4 of the plurality of types of standard cells are ½ times the horizontal pitch Ph of the placement grid (or the unit width Wu of the standard cells).

In this case, the design rule violation occurs between the threshold voltage adjusting patterns of the high threshold voltage cells, which are placed adjacently in the vertical or horizontal directions, only at position C shown in FIG. 5. At this position, two high threshold voltage cells are placed adjacently in the vertical direction with their cell frames contacting with each other along a width of the horizontal pitch Ph of the placement grid. Further, the design rule violation at that position occurs with the same situation. That is, the corners of the threshold voltage adjusting patterns contact with each other. Accordingly, the violation may be easily resolved by placing the same violation-resolving pattern having the same shape and the same size, which is prepared beforehand.

Note that, in FIGS. 5, 6, 7, 8, 9, and 10 that are explained above, the plurality of types of standard cells are placed while flipping them in the vertical direction, but without flipping them in the horizontal direction. However, it is also possible to place them while flipping them in the horizontal direction, if it is needed.

It is not indispensable for this invention to set the distances D1, D2, D3, and D4 between the left and right boundaries of the threshold voltage adjusting pattern and the left and right boundaries of the cell frame the same. For example, all or some of these distances may be changed with a unit distance of ½ times the horizontal pitch Ph of the placement grid (or ½ times the unit width of the standard cell).

Figure 11:
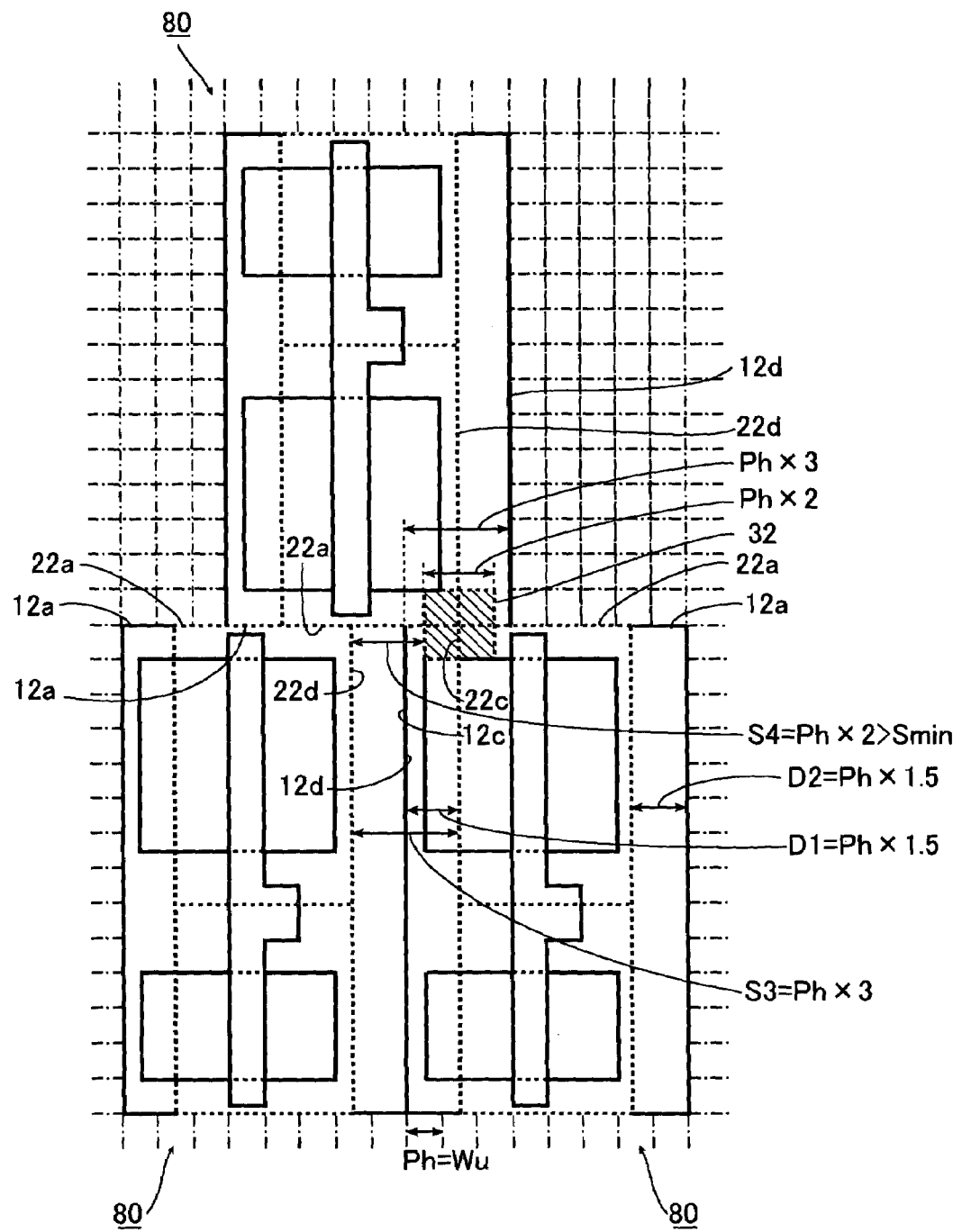
FIG. 11 is an exemplary layout diagram in which another exemplary high threshold voltage cell is placed.

FIG. 11 shows an exemplary layout where all of D1, D2, D3, and D4 are set to be 1.5 times the horizontal pitch Ph of the placement grid (or the unit width of the standard cell Wu).

In FIG. 11, three high threshold voltage cells 80 in which D1=D2=D3=D4=Ph×1.5 are placed. That is, on the lower right and the upper left sides of FIG. 11, two high threshold voltage cells 80, which are placed with their upper boundaries 12a of the cell frames 12 contact with each other along a length of 3 times the horizontal pitch Ph of the placement grid (or the unit width Wu of the standard cell), are shown. On the lower left side of FIG. 11, in addition, the third high threshold voltage cell 80 is placed such that its upper boundary 12a and the right boundary 12d of the cell frame contact the upper boundary 12a and the left boundary 12c, respectively, of the cell frame 12 of different high threshold voltage cells 80.

The threshold voltage adjusting patterns of two high threshold voltage cells 80, which are placed on the lower right and the upper left sides, contact with each other at their corners. As a result, a design rule violation occurs. However, the situation of occurrence of the design rule violation is the same as that shown in FIG. 8. That is, the threshold voltage adjusting patterns contact with each other at their corners. Accordingly, same as the case shown in FIG. 9, the violation may be easily resolved by placing the only one type of violation-resolving pattern 32, which is prepared beforehand.

Note that, when D1=D2=D3=D4=Ph×1.5, a space S3 of 3 times the horizontal pitch Ph of the placement grid is formed between the threshold voltage adjusting patterns 22 of the high threshold voltage cells 80, which are placed adjacently in the horizontal direction on the lower side of FIG. 11. Accordingly, as shown in FIG. 11, a space S4 of 2 times the horizontal pitch Ph remains after placing the violation-resolving pattern 32 having a width of 2 times the grid pitch Ph. However, the remaining space S4 is larger than the minimum allowable space Smin. Thus, no design rule violation occurs.

Although FIG. 11 shows the case that the first threshold voltage adjusting patterns 22 are placed adjacently in the vertical direction, the situation is the same when the second threshold voltage adjusting patterns are placed adjacently in the vertical direction.

Although not shown in drawings, when D1=D2=D3=D4=Ph×1.5=Wu×1.5, no design rule violation occurs between the threshold voltage adjusting patterns of the high threshold voltage cells placed adjacently in the vertical direction, except for the case shown in FIG. 11. For example, the situation is the same as shown in FIG. 6 when the cell frames of vertically adjacent high threshold voltage cells contact with each other at their corners, or along a width of 1 time or 2 times the horizontal pitch Ph of the placement grid (or the unit width Wu of the standard cell). That is, a space of 1 time the grid pitch Ph or more is formed between the threshold voltage adjusting patterns of the high threshold voltage cells that are placed adjacently with each other in the vertical direction. Further, the situation is the same as shown in FIG. 7 when the cell frames of vertically adjacent high threshold voltage cells contact with each other along a width of 4 times the horizontal pitch Ph of the placement grid (or the unit width Wu of the standard cell) or more. That is, the threshold voltage adjusting patterns of the vertically adjacent high threshold voltage cells contact with each other along a width of 1 time the grid pitch or more and are merged.

It is also possible to set, for example, all of D1, D2, D3, and D4 to be zero. In this case, for example, when the corners of the frames of high threshold voltage cells, which are placed adjacently in the vertical direction, contact with each other, the threshold voltage adjusting patterns contact at their corners, and a design rule violation occurs. Also in this case, the design rule violation may be resolved by adding the same violation-resolving pattern 32 as shown in FIG. 9. Note that, in this case, the threshold voltage adjusting patterns of the high threshold voltage cells, which are placed adjacently with each other in the horizontal direction, contact at the left or right boundary of the cell frame and merge with each other. Accordingly, no small space that does not meet the design rule is formed between the threshold voltage adjusting patterns of the horizontally adjacent high threshold voltage cells.

As explained above, it is possible to specify the situation that the design rule violation occurs between the threshold voltage adjusting patterns of vertically adjacent high threshold voltage cells not only when each of the distances D1, D2, D3, and D4 between the left and right boundaries of the threshold voltage adjusting pattern and the left and right boundaries of the cell frame is ½ times the horizontal pitch Ph, but also when each of the distances is n/2 times the horizontal pitch Ph of the placement grid (or the unit width Wu of the standard cell). As a result, it is possible to easily resolve the violation. It is further possible to prevent the occurrence of design rule violation between the threshold voltage adjusting patterns of horizontally adjacent high threshold voltage cells. Here, n is an integer greater than zero.

In this case, it is not necessary that the values of n are the same for all of the plurality of types of high threshold voltage cells included in the exemplary cell library. Moreover, the values of n for D1, D2, D3, and D4 in each of the high threshold voltage cells are not necessary the same. That is, when D1=Ph×n1/2 (or D1=Wu×n1/2), D2=Ph×n2/2 (or D2=Wu×n2/2), D3=Ph×n3/2 (or D3=Wu×n3/2), and D4=Ph×n4/2 (or D4=Wu×n4/2), ni (i=1, 2, 3, 4) is an integer equal to or greater than zero and may be different for each of the plurality of type of high threshold voltage cells and for each the value of i.

When ni is not the same for, for example, all of the plurality of type of high threshold voltage cells, the positional relationship between the vertically adjacent high threshold voltage cells that the design rule violation occurs is not specified. The exemplary method of designing shown in FIG. 3 may be practiced even if the design rule violation occurs at any positional relationship. That is, the positions where the design rule violations occur may be identified by the checking of design rule violation in ST6 and the violation may be resolved by placing the violation-resolving pattern at the identified positions in ST7.

It is preferable that, however, both of n1 and n2 are even numbers or odd numbers in order to specify the positional relationship between high threshold voltage cells that the design rule violation occurs. It is also preferable that both of n3 and n4 are even numbers or odd numbers.

For example, FIGS. 6 to 8 show the case that n1=n2=n3=n4=1. In this exemplary embodiment, the positional relationship between high threshold voltage cells that the design rule violation occurs is specified to only one relationship shown in FIG. 8, i.e., the cell frames of vertically adjacent high threshold voltage cells contact with each other along a width of the horizontal pitch of the placement grid Ph.

On the other hand, when n1=1 and n2=2, the first threshold voltage adjusting patterns of vertically adjacent high threshold voltage cells cannot contact at their corners. However, a space of Ph×½ is formed between the first threshold voltage adjusting patterns of the high threshold voltage cells that are placed adjacently in the vertical direction such that their cell frames contact with each other along a width of Ph. In addition, the first threshold voltage adjusting patterns of the high threshold voltage cell, which are placed adjacently in the vertical direction with their cell frames contacting with each other along a width of Ph×2, contact with each other along a width of Ph×½. In the exemplary 130 nm-node semiconductor integrated circuit explained above (Ph=0.41 μm, Smin=Wmin=0.31 μm), design rule violations occur in both of the positional relationships between the high threshold voltage cells. As a result, the mathematical operation required for resolving the violations increases compared to the case of the exemplary embodiment where the violation occurs in only one specified positional relationship.

Note that, by setting Ph≧Smin×2 or Ph≧Wmin×2, occurrence of design rule violation may be prevented in either of the positional relationships explained above. However, enlarging the pitch of the placement grid would increase the area of the circuit block. Thus, it is preferable to set the relationship between Smin and Wmin (which are usually set to be the same for the first and the second threshold voltage adjusting patterns, but when they are set differently, the smaller ones of them) and Ph as Ph<Smin×2 and Ph<Wmin×2 in order to enable a decrease of the area of the circuit block. In this case, it is also preferable to apply the restriction (both n1 and n2 are even numbers or odd numbers, and both n3 and n4 are even numbers or odd numbers) for the distances between the left and right boundaries of the first and the second threshold voltage adjusting patterns and the left and right boundaries of the cell frames in order to specify the positional relationship between the high threshold voltage cells that the design rule violation occurs.

Further, in the formation of actual circuit blocks, arbitrary ones of the plurality of types of high threshold voltage cells included in the exemplary standard cell library may be placed adjacently with each other in the vertical direction. Accordingly, it is preferable that, for all of the plurality of types of high threshold voltage cells included in the standard cell library, both n1 and n2 are even numbers or odd numbers, and both n3 and n4 are even numbers or odd numbers.

It is further preferable, for all of the plurality of types of high threshold voltage cells included in the exemplary standard cell library, to set all of n1, n2, n3, and n4 to be even numbers or odd numbers. In this case, it is possible to make the positions where the design rule violations occur in relation to the vertical placement grid the same for both of the first and the second threshold voltage adjusting patterns. As a result, the violation may be resolved more easily.

Moreover, it is not indispensable for this invention to set D1, D2, D3, and D4 to be n/2 times Ph (or Wu). For example, the distances between the left and right boundaries of the threshold voltage adjusting patterns and the left and right boundaries of the cell frame may be expressed as Di=di+Ph×ni/2 (or Di=di+Wu×ni/2). Here, −Ph/2<di<Ph/2 (or −Wu/2<di<Wu/2). Here, di is a value representing a difference between Di and Ph×ni/2 (or Wu×ni/2) and is expressed as di=Di−Ph×ni/2 (or di=Di−Wu×ni/2).

FIG. 6 shows the case that n1=n2=1 and d1=d2=0. Thus, the distance between the first threshold voltage adjusting patterns 22 of the two high threshold voltage cell 10, which are placed adjacently in the vertical direction, is S1=Ph=Wu. The distance would be Ph+(d1+d2)=Wu+(d1+d2) if one or both of d1 and d2 is not equal to zero. Nonetheless, no small space less than Smin, which would violate the design rule, would be formed within a range that Ph+(d1+d2)≧Smin (or Wu+(d1+d2)≧Smin). When Ph=Wu=0.41 μm, and Smin=0.31 μm, as exemplified above, a range of (d1+d2)≧−0.1 μm is permissible.

Similar result may be achieved for similar distance between the second threshold voltage adjusting patterns 24. That is, no design rule violation would occur at the position where the second threshold voltage adjusting patterns are placed adjacently with each other with the relationship shown in FIG. 6 within a range that Ph+(d3+d4)≧Smin (or Wu+(d3+d4)≧Smin).

Next, FIG. 7 shows the case that n1=n2=1 and d1=d2=0, and the first threshold voltage adjusting patterns 22 of two high threshold voltage cell 10, which are placed adjacently in the vertical direction, contact with each other along a width of W1=Ph=Wu. The width would be Ph−(d1+d2)=Wu−(d1+d2) if one or both of d1 and d2 is not equal to zero. Nonetheless, a portion of a width of less than Wmin, that would violate the design rule, would not be formed within a range that Ph−(d1+d2)≧Wmin (or Wu−(d1+d2)≧Wmin). When Ph=Wu=0.41 μm, and Smin=0.31 μm, as exemplified above, a range of (d1+d2)≦−0.1 μm is permissible.

Similar result may be achieved for similar distance between the second threshold voltage adjusting patterns. That is, no design rule violation would occur at the position where the second threshold voltage adjusting patterns are placed adjacently with each other with the relationship shown in FIG. 7 within a range that Ph−(d3+d4)≧Wmin (or Wu−(d3+d4)≧Wmin).

Further, at the position shown in FIG. 9, the first threshold voltage adjusting patterns 22 of the high threshold voltage cells, which are adjacent with each other in the vertical direction, do not contact with each other at their corners when d1+d2 is not equal to zero. When d1+d2>0, the first threshold voltage adjusting patterns 22 contact with each other along a width of d1+d2. When d1+d2<0, on the other hand, a space equal to an absolute value of d1+d2 is formed between the first threshold voltage adjusting patterns 22. As explained above, it is preferable to set Smin≦Ph<Smin×2 and Wmin≦Ph<Wmin×2 in order to enable a decrease of the area of the circuit block. When it is further set d1+d2 within the range that does not create a design rule violation at the positions shown in FIGS. 6 and 7, a design rule violation occurs at the position shown in FIG. 9.

However, the violation may be easily resolved by placing a violation-resolving pattern if the position where the design rule violation occurs is specified. The situation is the same for the second threshold voltage adjusting pattern. An adjustment of the dimension of the violation-resolving pattern may be necessitated depending on the value of d1+d2. However, if the value of d1+d2 is known beforehand, a violation-resolving pattern with an appropriate size may be prepared at step ST2 in FIG. 3. As a result, it becomes possible to easily resolve the design rule violation by merely placing the violation-resolving pattern, which is prepared beforehand, at step ST7.

Note that, however, dimensions of the small spaces or widths, which are formed at the positions where the design rule violation occur and do not meet the design rule, vary if the values d1, d2, d3, and d4 are different between the plurality of types of high threshold voltage cells included in the exemplary standard cell library. As a result, it may become necessary to prepare a plurality of design rule violation-resolving patterns with various dimensions at step ST2 in FIG. 3. It may become also necessary to select a violation-resolving pattern with an appropriate dimension from the plurality of design rule violation-resolving patterns at step ST7. Accordingly, it is preferable to set each of d1, d2, d3, and d4 to be the same among the plurality of types of high threshold voltage cells included in the exemplary cell library. Thereby, it is possible to prevent the procedure noted above from increasing the amount of mathematical operations.

It is further preferable to set d1=d2 and d3=d4. In this case, it becomes possible to make the dimensions of small spaces or widths, which are formed at the positions where the design rule violation occur, constant even if the high threshold voltage cells are placed while being flipped in the horizontal direction. Accordingly, it becomes possible to easily resolve the violations occurred by placing the plurality of types of high threshold voltage cells in the circuit block. That is, the violations may be resolved by placing the same violation-resolving pattern having the same shape and dimension at a plurality of positions where the violation occurred, even if the high threshold voltage cells are placed while being flipped in the horizontal direction.

It is further preferable to set d1+d2=d3+d4. In this case, the situation of the design rule violation (i.e., the dimension of small space or width that does not meet the design rule, which is formed at the position of violation) for the first threshold voltage adjusting pattern becomes the same as the situation of the design rule violation for the second threshold voltage threshold adjusting pattern. Accordingly, violation-resolving patterns having the same shape and dimension may be used to resolve the design rule violation for the first and the second threshold voltage adjusting patterns.

It is still further preferable to set d1+d2≦0 when n1=n2=0 in order to prevent occurrence of design rule violation between the threshold voltage adjusting patterns of high threshold voltage cells that are adjacent with each other in the horizontal direction. If it is set that d1+d2>0 when n1=n2=0, a space of d1+d2 is formed between the first threshold voltage adjusting patterns of high threshold voltage cells that are adjacent with each other in the horizontal direction. As a result, when it is set that Smin≦Ph<Smin×2 and Wmin≦Ph<Wmin×2 and it is further set d1+d2 within the range that does not create a design rule violation at the positions shown in FIGS. 6 and 7, a design rule violation occurs between the threshold voltage adjusting patterns of high threshold voltage cells that are adjacent with each other in the horizontal direction. Similarly, it is preferable to set d3+d4≦0 when n3=n4=0.

As explained above, in the standard cell having threshold voltage adjusting patterns included in the exemplary cell library according to the embodiment of this invention, the upper boundary of the first threshold voltage adjusting pattern and the lower boundary of the second threshold voltage adjusting pattern contact the upper and the lower boundaries of the cell frame, respectively. In addition, the distances between the left and right boundaries of the threshold voltage adjusting patterns and the left and right boundaries of the cell frame are set appropriately. Accordingly, when the cells having the threshold voltage adjusting patterns are placed adjacently with each other, a positional relationship that the design rule violation occurs may be specified, and the violation may be easily resolved.

In the method of designing semiconductor integrated circuit according to the exemplary embodiment of this invention, when the standard cells are placed to form a circuit block, the positional relationship between the standard cells that the design rule violation occurs is specified. That is, it is possible to prevent occurrence of design rule violation between the threshold voltage adjusting patterns of adjacent standard cells except for the case that the standard cells are placed with a specified positional relationship. Further, the design rule violation that occurs in the case of the placement with the specified positional relationship may be easily resolved by placing a violation-resolving pattern that is prepared beforehand. As a result, it becomes possible to design semiconductor integrated circuit patterns in which cells having transistors with different threshold voltages are placed at arbitrary positions without causing the increase of time and cost.

Furthermore, by using the semiconductor integrated circuit pattern thus designed, a semiconductor integrated circuit that realizes both high operation speed and low leakage current by placing the cells having transistors with different threshold voltages at arbitrary positions can be manufactured.

In the explanations above, it is assumed that the standard cells having threshold voltage adjusting patterns are high threshold voltage cells. As noted above, however, it is also possible to make the standard cells having threshold voltage adjusting patterns low threshold voltage cells.

In actual standard cells, patterns in different layers that are omitted in FIG. 1, and so on, are also arranged. For example, an input wiring pattern for forming an input terminal to the gate 20, an output wiring pattern for forming an output terminal of the inverter by connecting the drain 46 of the PMOS transistor 40 and the drain 56 of the NMOS transistor 50, power-supply wiring patterns for supplying Vdd and GND potentials are not shown in FIG. 1. Contact hole patterns for connecting these wirings to corresponding portions of the transistors 40 and 50 are not shown in FIG. 1, either. Further, as an active layer pattern, in addition to the portions shown in FIG. 1, a portion for supplying the Vdd potential to the source region 44 of the PMOS transistor 40, and a portion for supplying the GND potential to the source region 54 of the N-channel MOS transistor are also arranged.

The Vdd power-supply wiring pattern may be arranged along the upper boundary 12a of the cell frame 12, and the GND power-supply pattern may be arranged along the lower boundary 12b of the cell frame 12 such that they extend along the entire width of the cell 10. When forming a circuit block 70 by placing the standard cells as shown in FIG. 5, power-supply wiring patterns of the cells that are placed in the horizontal and vertical directions are merged. As a result, Vdd and GND power-supply wirings that extend along the entire horizontal dimension of the circuit block may be placed alternately at each boundary between the cell rows. That is, the Vdd power-supply wirings and the GND power-supply wirings may be placed alternately in the vertical direction of the circuit block 70.

Similarly, the N-well patterns and the P-well patterns (the reversed patterns of the N-well patterns) are also merged during the formation of the circuit block 70. And N-well and P-well patterns that extend along an entire horizontal dimension of the circuit block 70 may be placed alternately in the vertical direction.

Note that, by arranging the Vdd and GND power-supply wiring patterns in the second or upper metal layers, it becomes possible to extend the active region patterns and the gate pattern to the vicinity of the upper and the lower boundaries of the cell frame. As a result, it is possible to increase the driving capabilities of the transistors. In this case, it also becomes necessary to extend the threshold voltage adjusting patterns to the vicinity of the upper and the lower boundaries of the cell frame. This embodiment described above may be particularly advantageously applied to the standard cells having such layout.

In the standard cell 10 shown in FIG. 1, both the first and the second threshold voltage adjusting patterns 22 and 24 have rectangular shapes. This is not, however, indispensable for the embodiments of this invention. It is also possible to adopt various different shapes. In this case, each of the left and the right boundaries of the threshold voltage adjusting patterns may be divided into a plurality of portions.

When each of the left and right boundaries of the threshold voltage adjusting patterns are divided into a plurality of portions, it is necessary to appropriately set the distances between specific portions of the left and right boundaries of the threshold voltage adjusting patterns and the left and right boundaries of the cell frame. That is, it is necessary to appropriately set the distances between portions of the left and right boundaries, which are connected to the portions of the upper or lower boundary that contact the upper or lower boundaries of the cell frame, and the left and right boundaries of the cell frame. Thereby, it becomes possible to specify the positional relationship of the standard cells that creates the design rule violation between the threshold voltage adjusting patterns of the standard cells that are adjacent with each other in the vertical direction. As a result, it becomes possible to easily resolve the violation.

For the threshold voltage adjusting pattern that is arranged on the upper side of the standard cell, for example, it is necessary to appropriately set the distances between the portions of the left and right boundaries of the threshold voltage adjusting pattern, which are connected to the portion of the upper boundary that contacts the upper boundary of the cell frame, and the left and right boundaries of the cell frame. For the threshold voltage adjusting pattern that is arranged on the lower side of the standard cell, it is necessary to appropriately set the distances between portions of the left and right boundaries of the threshold voltage adjusting pattern, which are connected to the portion of the lower boundary that contacts the lower boundary of the cell frame, and the left and right boundaries of the cell frame.

In order to prevent the occurrence of design rule violation between the threshold voltage adjusting patterns of the cells that are adjacent with each other in the horizontal direction, it is necessary to appropriately set the distance between each of the divided portions of the left and right boundaries of the threshold voltage adjusting patterns and the left and right boundaries of the cell frame.

So far, an exemplary standard cell library, an exemplary method of designing semiconductor integrated circuit, an exemplary semiconductor integrated circuit pattern, and an exemplary semiconductor integrated circuit according to this invention are explained in detail in reference to specific embodiments. However, this invention is not limited to the embodiments described above, but various improvements and modifications may be made within the spirit of this invention.

What is claimed is:

1. A standard cell library comprising:
 a plurality of types of standard cells, each standard cell including patterns in a plurality of layers arranged within a cell frame, the cell frame having a fixed height and a width of an integer times a unit width Wu, for forming a semiconductor integrated circuit by placing selected ones of the plurality of types of standard cells such that left, right, upper, and lower boundaries of the cell frame being in contact with boundaries of other cell frames, the plurality of types of standard cells including a first plurality of types of standard cells, the patterns of each of the first plurality of types of standard cells including:
 first transistor patterns for forming a first conduction-type transistor arranged within an upper side of the cell frame and second transistor patterns for forming a second conduction-type transistor arranged within a lower side of the cell frame;
 a first threshold voltage adjusting pattern for doping a first impurity to adjust an threshold voltage of the first conduction-type transistor, the first threshold voltage adjusting pattern having an upper boundary that contacts the upper boundary of the cell frame, and having a left and a right boundary, and a second threshold voltage adjusting pattern for doping a second impurity to adjust an threshold voltage of the second conduction-type transistor, the second threshold voltage adjusting pattern having a lower boundary that contacts the lower boundary of the cell frame, and having a left and a right boundary,
 wherein:
 each of a distance D1 between the left boundary of the first threshold voltage adjusting pattern and the left boundary of the cell frame, a distance D2 between the right boundary of the first threshold voltage adjusting pattern and the right boundary of the cell frame, a distance D3 between the left boundary of the second threshold voltage adjusting pattern and the left boundary of the cell frame, and a distance D4 between the right boundary of the second threshold voltage adjusting pattern and the right boundary of the cell frame is expressed as $Di = Wu \times ni/2$ (i=1, 2, 3, 4, ni is an integer equal to or larger than 0); and
 $Wu \geq Wmin$ and $Wu \geq Smin$ where Wmin is a minimum allowable width and Smin is a minimum allowable space set by a design rule of the semiconductor integrated circuit for each of the first and the second threshold voltage adjusting patterns, both n1 and n2 are even numbers or odd numbers and both n3 and n4 are even numbers or odd numbers for all of the first plurality of types of standard cells.

2. The standard cell library according to claim 1, wherein all of n1, n2, n3, and n4 are even numbers or all of n1, n2, n3, and n4 are odd numbers for all of the first plurality of types of standard cells.

3. The standard cell library according to claim 1, wherein $Wu < Wmin \times 2$ and $Wu < Smin \times 2$.

4. A standard cell library comprising:
 a plurality of types of standard cells, each standard cell including patterns in a plurality of layers arranged within a cell frame, the cell frame having a fixed height and a width of an integer times a unit width Wu, for forming a semiconductor integrated circuit by placing selected ones of the plurality of types of standard cells such that left, right, upper, and lower boundaries of the cell frame being in contact with boundaries of other cell frames, the plurality of types of standard cells including a first plurality of types of standard cells, the patterns of each of the first plurality of types of standard cells including:
 first transistor patterns for forming a first conduction-type transistor arranged within an upper side of the cell frame and second transistor patterns for forming a second conduction-type transistor arranged within a lower side of the cell frame;
 a first threshold voltage adjusting pattern for doping a first impurity to adjust an threshold voltage of the first conduction-type transistor, the first threshold voltage adjusting pattern having an upper boundary that contacts the upper boundary of the cell frame, and having a left and a right boundary, and a second threshold voltage adjusting pattern for doping a second impurity to adjust an threshold voltage of the second conduction-type transistor, the second threshold voltage adjusting pattern having a lower boundary that contacts the lower boundary of the cell frame, and having a left and a right boundary, wherein:
each of a distance D1 between the left boundary of the first threshold voltage adjusting pattern and the left boundary of the cell frame, a distance D2 between the right boundary of the first threshold voltage adjusting pattern and the right boundary of the cell frame, a distance D3 between the left boundary of the second threshold voltage adjusting pattern and the left boundary of the cell frame, and a distance D4 between the right boundary of the second threshold voltage adjusting pattern and the right boundary of the cell frame is expressed as $Di=di+Wu \times ni/2$ ($i=1, 2, 3, 4$, $-Wu/2 < di < Wu/2$, $ni$ is an integer equal to or larger than 0), di being a value representing a difference between Di and $Wu \times ni/2$;

$Wu \geq Wmin$ and $Wu \geq Smin$ where Wmin is a minimum allowable width and Smin is a minimum allowable space set by a design rule of the semiconductor integrated circuit for each of the first and the second threshold voltage adjusting patterns, both n1 and n2 are even numbers or odd numbers and both n3 and n4 are even numbers or odd numbers for all of the first plurality of types of standard cells; and all of the first plurality of types of standard cells have a same d1, a same d2, a same d3, and a same d4, $Wu+(d1+d2) \geq Smin$ and $Wu-(d1+d2) \geq Wmin$, $Wu+(d3+d4) \geq Smin$ and $Wu-(d3+d4) \geq Wmin$, $d1+d2 \leq 0$ when $n1=n2=0$ and $d3+d4 \leq 0$ when $n3=n4=0$.

5. The standard cell library according to claim 4 wherein, $d1=d2$ and $d3=d4$.

6. The standard cell library according to claim 4, wherein $d1+d2=d3+d4$.

7. The standard cell library according to claim 4, wherein all of n1, n2, n3, and n4 are even numbers or all of n1, n2, n3, and n4 are odd numbers for all of the first plurality of types of standard cells.

8. The standard cell library according to claim 4, wherein $Wu < Wmin \times 2$ and $Wu < Smin \times 2$.

9. A method of designing a semiconductor integrated circuit comprising:

preparing a standard cell library including a plurality of types of standard cells, each standard cell including patterns in a plurality of layers arranged within a cell frame having a fixed height and a width of an integer times a unit width Wu;

selecting at least some of the plurality of types of standard cells; and placing the selected ones of the standard cells along a grid having a horizontal pitch Ph while alternately flipping the selected ones of the standard cells in a vertical direction to form a circuit block such that left, right, upper, and lower boundaries of the cell frame are in contact with boundaries of other cell frames, the plurality of types of standard cell including a first plurality of types of standard cells, the patterns of each of the first plurality of types of standard cells including:

first transistor patterns for forming a first conduction-type transistor arranged within an upper side of the cell frame and second transistor patterns for forming a second conduction-type transistor arranged within a lower side of the cell frame;

a first threshold voltage adjusting pattern for doping a first impurity to adjust an threshold voltage of the first conduction-type transistor, the first threshold voltage adjusting pattern having an upper boundary that contacts the upper boundary of the cell frame, and having a left and a right boundary, and a second threshold voltage adjusting pattern for doping a second impurity to adjust an threshold voltage of the second conduction-type transistor, the second threshold voltage adjusting pattern having a lower boundary that contacts the lower boundary of the cell frame, and having a left and a right boundary, wherein:
each of a distance D1 between the left boundary of the first threshold voltage adjusting pattern and the left boundary of the cell frame, a distance D2 between the right boundary of the first threshold voltage adjusting pattern and the right boundary of the cell frame, a distance D3 between the left boundary of the second threshold voltage adjusting pattern and the left boundary of the cell frame, and a distance D4 between the right boundary of the second threshold voltage adjusting pattern and the right boundary of the cell frame is expressed as $Di=Ph \times ni/2$ ($i=1, 2, 3, 4$, $ni$ is an integer equal to or larger than 0); and $Ph \geq Wmin$ and $Ph \geq Smin$ where Wmin is a minimum allowable width and Smin is a minimum allowable space set by a design rule of the semiconductor integrated circuit for each of the first and the second threshold voltage adjusting patterns, both n1 and n2 are even numbers or odd numbers and both n3 and n4 are even numbers or odd numbers for all of the first plurality of types of standard cells.

10. The method of designing a semiconductor integrated circuit according to claim 9, wherein all of n1, n2, n3, and n4 are even numbers or all of n1, n2, n3, and n4 are odd numbers for all of the first plurality of types of standard cells.

11. The method of designing a semiconductor integrated circuit according to claim 9, further comprising:

checking if there is violation of the design rule in each of the first and the second threshold voltage adjusting patterns in the formed circuit block; and resolving the violation by placing a violation-resolving pattern, which is prepared beforehand, to a position where the violation is found by the checking.

12. The method of designing a semiconductor integrated circuit according to claim 9, wherein $Ph < Wmin \times 2$ and $Ph < Smin \times 2$.

13. The method of designing a semiconductor integrated circuit accordingly to claim 9, wherein $Wu=Ph$.

14. A method of designing a semiconductor integrated circuit comprising:

preparing a standard cell library including a plurality of types of standard cells, each standard cell including patterns in a plurality of layers arranged within a cell frame having a fixed height and a width of an integer times a unit width Wu;

selecting at least some of the plurality of types of standard cells; and placing the selected ones of the standard cells along a grid having a horizontal pitch Ph while alternately flipping the selected ones of the standard cells in a vertical direction to form a circuit block such that left, right, upper, and lower boundaries of the cell frame are in contact with boundaries of other cell frames, the plurality of types of standard cell including a first plurality of types of standard cells, the patterns of each of the first plurality of types of standard cells comprising:

first transistor patterns for forming a first conduction-type transistor arranged within an upper side of the cell frame and second transistor patterns for forming a second conduction-type transistor arranged within a lower side of the cell frame;

a first threshold voltage adjusting pattern for doping a first impurity to adjust an threshold voltage of the first conduction-type transistor, the first threshold voltage adjusting pattern having an upper boundary that contacts the upper boundary of the cell frame, and having a left and a right boundary, and a second threshold voltage adjusting pattern for doping a second impurity to adjust an threshold voltage of the second conduction-type transistor, the second threshold voltage adjusting pattern having a lower boundary that contacts the lower boundary of the cell frame, and having a left and a right boundary, wherein:

each of a distance D1 between the left boundary of the first threshold voltage adjusting pattern and the left boundary of the cell frame, a distance D2 between the right boundary of the first threshold voltage adjusting pattern and the right boundary of the cell frame, a distance D3 between the left boundary of the second threshold voltage adjusting pattern and the left boundary of the cell frame, and a distance D4 between the right boundary of the second threshold voltage adjusting pattern and the right boundary of the cell frame is expressed as Di=di+Ph×ni/2 (i=1, 2, 3, 4, −Ph/2<di<Ph/2, ni is an integer equal to or larger than 0), di being a value representing a difference between Di and Wu×ni/2;

Ph≧Wmin and Ph≧Smin where Wmin is a minimum allowable width and Smin is a minimum allowable space set by a design rule of the semiconductor integrated circuit for each of the first and the second threshold voltage adjusting patterns, both n1 and n2 are even numbers or odd numbers and both n3 and n4 are even numbers or odd numbers for all of the first plurality of types of standard cells; and all of the first plurality of types of standard cells have a same d1, a same d2, a same d3, and a same d4, Ph+(d1+d2)≧Smin and Ph−(d1+d2)≧Wmin, Ph+(d3+d4)≧Smin and Ph−(d3+d4)≧Wmin, d1+d2≦0 when n1=n2=0 and d3+d4≦0 when n3=n4=0.

15. The method of designing a semiconductor integrated circuit according to claim 14, wherein d1=d2 and d3=d4.

16. The method of designing a semiconductor integrated circuit according to claim 14, wherein d1+d2=d3+d4.

17. The method of designing a semiconductor integrated circuit according to claim 14, wherein all of n1, n2, n3, and n4 are even numbers or all of n1, n2, n3, and n4 are odd numbers for all of the first plurality of types of standard cells.

18. The method of designing a semiconductor integrated circuit according to claim 14, further comprising the steps of:

checking if there is violation of the design rule in each of the first and the second threshold voltage adjusting patterns in the formed circuit block; and resolving the violation by placing a violation-resolving pattern, which is prepared beforehand, to a position where the violation is found by the checking.

19. The method of designing a semiconductor integrated circuit according to claim 14, wherein Ph<Wmin×2 and Ph<Smin×2.

20. The method of designing a semiconductor integrated circuit accordingly to claim 14, wherein Wu=Ph.

21. A semiconductor integrated circuit pattern comprising:

a circuit block formed by placing a plurality of types of standard cells, each standard cell including patterns in a plurality of layers arranged within a cell frame, the cell frame having a fixed height and a width of an integer times a unit width Wu, along a grid having a horizontal pitch Ph while alternately flipping the plurality of types of standard cells in a vertical direction such that left, right, upper, and lower boundaries of the cell frame being in contact with boundaries of other cell frames, the plurality of types of standard cells including a first plurality of types of standard cells, the patterns of each of the first plurality of types of standard cells including:

first transistor patterns for forming a first conduction-type transistor arranged within an upper side of the cell frame and second transistor patterns for forming a second conduction-type transistor arranged within a lower side of the cell frame;

a first threshold voltage adjusting pattern for doping a first impurity to adjust an threshold voltage of the first conduction-type transistor, the first threshold voltage adjusting pattern having an upper boundary that contacts the upper boundary of the cell frame, and having a left and a right boundary, and a second threshold voltage adjusting pattern for doping a second impurity to adjust an threshold voltage of the second conduction-type transistor, the second threshold voltage adjusting pattern having a lower boundary that contacts the lower boundary of the cell frame, and having a left and a right boundary, wherein:

each of a distance D1 between the left boundary of the first threshold voltage adjusting pattern and the left boundary of the cell frame, a distance D2 between the right boundary of the first threshold voltage adjusting pattern and the right boundary of the cell frame, a distance D3 between the left boundary of the second threshold voltage adjusting pattern and the left boundary of the cell frame, and a distance D4 between the right boundary of the second threshold voltage adjusting pattern and the right boundary of the cell frame is expressed as Di=Ph×ni/2 (i=1, 2, 3, 4, ni is an integer equal to or larger than 0); and Ph≧Wmin and Ph≧Smin where Wmin is a minimum allowable width and Smin is a minimum allowable space set by a design rule of the semiconductor integrated circuit for each of the first and the second threshold voltage adjusting patterns, both n1 and n2 are even numbers or odd numbers and both n3 and n4 are even numbers or odd numbers for all of the first plurality of types of standard cells.

22. The semiconductor integrated circuit pattern according to claim 21 wherein all of n1, n2, n3, and n4 are even numbers or all of n1, n2, n3, and n4 are odd numbers for all of the first plurality of types of standard cells.

23. The semiconductor integrated circuit pattern according to claim 21, wherein same violation-resolving patterns are placed at a plurality of positions where design rule violations occur in each of the first and the second threshold voltage adjusting patterns in the circuit block such that the violations are resolved.

24. The semiconductor integrated circuit pattern according to claim 21, wherein Ph<Wmin×2 and Ph<Smin×2.

25. The semiconductor integrated circuit pattern according to claim 21, wherein Wu=Ph.

26. A semiconductor integrated circuit pattern comprising:
a circuit block formed by placing a plurality of types of standard cells, each standard cell including patterns in a plurality of layers arranged within a cell frame, the cell frame having a fixed height and a width of an integer times a unit width Wu, along a grid having a horizontal pitch Ph while alternately flipping the plurality of types of standard cells in a vertical direction such that left, right, upper, and lower boundaries of the cell frame being in contact with boundaries of other cell frames, the plurality of types of standard cells including a first plurality of types of standard cells, the patterns of each of the first plurality of types of standard cells including:
first transistor patterns for forming a first conduction-type transistor arranged within an upper side of the cell frame and second transistor patterns for forming a second conduction-type transistor arranged within a lower side of the cell frame;
a first threshold voltage adjusting pattern for doping a first impurity to adjust an threshold voltage of the first conduction-type transistor, the first threshold voltage adjusting pattern having an upper boundary that contacts the upper boundary of the cell frame, and having a left and a right boundary, and a second threshold voltage adjusting pattern for doping a second impurity to adjust an threshold voltage of the second conduction-type transistor, the second threshold voltage adjusting pattern having a lower boundary that contacts the lower boundary of the cell frame, and having a left and a right boundary,
wherein:
each of a distance D1 between the left boundary of the first threshold voltage adjusting pattern and the left boundary of the cell frame, a distance D2 between the right boundary of the first threshold voltage adjusting pattern and the right boundary of the cell frame, a distance D3 between the left boundary of the second threshold voltage adjusting pattern and the left boundary of the cell frame, and a distance D4 between the right boundary of the second threshold voltage adjusting pattern and the right boundary of the cell frame is expressed as $Di=di+Ph \times ni/2$ ($i=1, 2, 3, 4$, $-Ph/2 < di < Ph/2$, ni is an integer equal to or larger than 0), di being a value representing a difference between Di and $Wu \times ni/2$;
$Ph \geq Wmin$ and $Ph \geq Smin$ where Wmin is a minimum allowable width and Smin is a minimum allowable space set by a design rule of the semiconductor integrated circuit for each of the first and the second threshold voltage adjusting patterns, both of n1 and n2 are even numbers or odd numbers and both of n3 and n4 are even numbers or odd numbers for all of the first plurality of types of standard cells; and
all of the first plurality of types of standard cells have a same d1, a same d2, a same d3, and a same d4, $Ph+(d1+d2) \geq Smin$ and $Ph-(d1+d2) \geq Wmin$, $Ph+(d3+d4) \geq Smin$ and $Ph-(d3+d4) \geq Wmin$, $d1+d2 \leq 0$ when $n1=n2=0$ and $d3+d4 \leq 0$ when $n3=n4=0$.

27. The semiconductor integrated circuit pattern according to claim 26, wherein d1=d2 and d3=d4.

28. The semiconductor integrated circuit pattern according to claim 26, wherein d1+d2=d3+d4.

29. The semiconductor integrated circuit pattern according to claim 26, wherein all of n1, n2, n3, and n4 are even numbers or all of n1, n2, n3, and n4 are odd numbers for all of the first plurality of types of standard cells.

30. The semiconductor integrated circuit pattern according to claim 26, wherein same violation-resolving patterns are placed at a plurality of positions where design rule violations occur in each of the first and the second threshold voltage adjusting patterns in the circuit block such that the violations are resolved.

31. The semiconductor integrated circuit pattern according to claim 26, wherein $Ph < Wmin \times 2$ and $Ph < Smin \times 2$.

32. The semiconductor integrated circuit pattern according to claim 26, wherein Wu=Ph.

33. A semiconductor integrated circuit comprising a semiconductor integrated circuit pattern formed on a semiconductor substrate, the semiconductor integrated circuit pattern comprising:
a circuit block formed by placing a plurality of types of standard cells, each standard cell including patterns in a plurality of layers arranged within a cell frame, the cell frame having a fixed height and a width of an integer times a unit width Wu, along a grid having a horizontal pitch Ph while alternately flipping the plurality of types of standard cells in a vertical direction such that left, right, upper, and lower boundaries of the cell frame being in contact with boundaries of other cell frames, the plurality of types of standard cells including a first plurality of types of standard cells, the patterns of each of the first plurality of types of standard cells including:
first transistor patterns for forming a first conduction-type transistor arranged within an upper side of the cell frame and second transistor patterns for forming a second conduction-type transistor arranged within a lower side of the cell frame;
a first threshold voltage adjusting pattern for doping a first impurity to adjust an threshold voltage of the first conduction-type transistor, the first threshold voltage adjusting pattern having an upper boundary that contacts the upper boundary of the cell frame, and having a left and a right boundary, and a second threshold voltage adjusting pattern for doping a second impurity to adjust an threshold voltage of the second conduction-type transistor, the second threshold voltage adjusting pattern having a lower boundary that contacts the lower boundary of the cell frame, and having a left and a right boundary,
wherein:
each of a distance D1 between the left boundary of the first threshold voltage adjusting pattern and the left boundary of the cell frame, a distance D2 between the right boundary of the first threshold voltage adjusting pattern and the right boundary of the cell frame, a distance D3 between the left boundary of the second threshold voltage adjusting pattern and the left boundary of the cell frame, and a distance D4 between the right boundary of the second threshold voltage adjusting pattern and the right boundary of the cell frame is expressed as $Di=Ph \times ni/2$ ($i=1, 2, 3, 4$, ni is an integer equal to or larger than 0); and
$Ph \geq Wmin$ and $Ph \geq Smin$ where Wmin is a minimum allowable width and Smin is a minimum allowable space set by a design rule of the semiconductor integrated circuit for each of the first and the second threshold voltage adjusting patterns, both n1 and n2 are even numbers or odd numbers and both n3 and n4 are even numbers or odd numbers for all of the first plurality of types of standard cells.

34. A semiconductor integrated circuit comprising a semiconductor integrated circuit pattern formed on a semiconductor substrate, comprising:

a circuit block formed by placing a plurality of types of standard cells, each standard cell including patterns in a plurality of layers arranged within a cell frame, the cell frame having a fixed height and a width of an integer times a unit width Wu, along a grid having a horizontal pitch Ph while alternately flipping the plurality of types of standard cells in a vertical direction such that left, right, upper, and lower boundaries of the cell frame being in contact with boundaries of other cell frames, the plurality of types of standard cells including a first plurality of types of standard cells, the patterns of each of the first plurality of types of standard cells including:

first transistor patterns for forming a first conduction-type transistor arranged within an upper side of the cell frame and second transistor patterns for forming a second conduction-type transistor arranged within a lower side of the cell frame;

a first threshold voltage adjusting pattern for doping a first impurity to adjust an threshold voltage of the first conduction-type transistor, the first threshold voltage adjusting pattern having an upper boundary that contacts the upper boundary of the cell frame, and having a left and a right boundary, and a second threshold voltage adjusting pattern for doping a second impurity to adjust an threshold voltage of the second conduction-type transistor, the second threshold voltage adjusting pattern having a lower boundary that contacts the lower boundary of the cell frame, and having a left and a right boundary, wherein:

each of a distance D1 between the left boundary of the first threshold voltage adjusting pattern and the left boundary of the cell frame, a distance D2 between the right boundary of the first threshold voltage adjusting pattern and the right boundary of the cell frame, a distance D3 between the left boundary of the second threshold voltage adjusting pattern and the left boundary of the cell frame, and a distance D4 between the right boundary of the second threshold voltage adjusting pattern and the right boundary of the cell frame is $Di=di+Ph \times ni/2$ (i=1, 2, 3, 4, $-Ph/2<di<Ph/2$, ni is an integer equal to or larger than 0), di being a value representing a difference between Di and $Wu \times ni/2$;

$Ph \geq Wmin$ and $Ph \geq Smin$ where Wmin is a minimum allowable width and Smin is a minimum allowable space set by a design rule of the semiconductor integrated circuit for each of the first and the second threshold voltage adjusting patterns, both of n1 and n2 are even numbers or odd numbers and both of n3 and n4 are even numbers or odd numbers for all of the first plurality of types of standard cells; and all of the first plurality of types of standard cells have a same d1, a same d2, a same d3, and a same d4, $Ph+(d1+d2) \geq Smin$ and $Ph-(d1+d2) \geq Wmin$, $Ph+(d3+d4) \geq Smin$ and $Ph-(d3+d4) \geq Wmin$, $d1+d2 \leq 0$ when n1=n2=0 and $d3+d4 \leq 0$ when n3=n4=0.

* * * * *